United States Patent [19]
Majumdar et al.

[11] Patent Number: 5,432,471
[45] Date of Patent: Jul. 11, 1995

[54] INSULATED GATE SEMICONDUCTOR DEVICE

[75] Inventors: Gourab Majumdar; Shinji Hatae, both of Fukuoka; Mitsuharu Tabata, Tokyo; Takashi Marumo, Fukuoka, all of Japan

[73] Assignee: Mitsubishi Denki Kabushiki Kaisha, Tokyo, Japan

[21] Appl. No.: 113,896

[22] Filed: Aug. 31, 1993

[30] Foreign Application Priority Data

Sep. 4, 1992 [JP] Japan .................. 4-236903
Jan. 20, 1993 [JP] Japan .................. 5-007614

[51] Int. Cl.6 .............................................. H03K 17/16
[52] U.S. Cl. .................................. 327/380; 327/310; 327/312; 327/313; 327/387; 327/403; 327/427; 327/430; 327/432; 327/475
[58] Field of Search ............... 307/242, 299.1, 570, 307/572, 573, 574, 575, 576, 577, 579, 581, 583, 585, 630, 631, 632, 641, 642; 327/309, 310, 312, 313, 379, 380, 387, 389, 403, 404, 405, 427, 430, 432, 434, 453, 459, 475

[56] References Cited

U.S. PATENT DOCUMENTS

| | | | |
|---|---|---|---|
| 4,051,392 | 9/1977 | Rosenthal et al. | 307/584 |
| 4,532,443 | 7/1985 | Glennon | 327/404 |
| 4,599,554 | 7/1986 | Jaycox et al. | 307/584 |
| 4,675,561 | 6/1987 | Bowers | 327/389 |
| 4,750,079 | 6/1988 | Fay et al. | |
| 4,918,339 | 4/1990 | Shigeo et al. | 307/242 |
| 4,924,344 | 5/1990 | Guajardo | |
| 4,961,006 | 10/1990 | Pace et al. | 307/299.2 |
| 5,057,719 | 10/1991 | Niedra | 307/242 |
| 5,121,000 | 6/1992 | Naghshineh | 307/572 |
| 5,121,013 | 6/1992 | Chuang et al. | 307/572 |
| 5,124,595 | 6/1992 | Mandelcorn | 307/572 |
| 5,166,541 | 11/1992 | Mori | 307/572 |
| 5,237,213 | 8/1993 | Tanoi | 307/572 |
| 5,247,207 | 9/1993 | Wer et al. | 307/570 |
| 5,272,392 | 12/1993 | Wong et al. | 307/299.2 |
| 5,272,399 | 12/1993 | Tihanyi et al. | 307/572 |

FOREIGN PATENT DOCUMENTS

| | | |
|---|---|---|
| 0294887 | 12/1988 | European Pat. Off. . |
| 3202319 | 7/1983 | Germany . |
| 63-318781 | 12/1988 | Japan . |
| 64-68005 | 3/1989 | Japan . |
| 3-204223 | 9/1991 | Japan .................. 307/572 |
| 2248739 | 4/1992 | United Kingdom . |

OTHER PUBLICATIONS

Patent Abstracts of Japan, vol. 14, No. 479 (E-992), Oct. 18, 1990, JP 2 197 213, Aug. 3, 1990.
Patent Abstracts of Japan, vol. 10, No. 297 (E-444), Oct. 9, 1986, JP 61 114 613, Jun. 2, 1986.

Primary Examiner—Terry D. Cunningham
Attorney, Agent, or Firm—Oblon, Spivak, McClelland, Maier, & Neustadt

[57] ABSTRACT

In order to prevent a malfunction caused by an electrical noise and limit an excessive main current at a high speed while cutting off the same to a value close to zero, the main current is regulated by an IGBT (1) which is connected with a load. A part of this main current is shunted to another IGBT (2). The as-shunted current flows through a resistor (3), to be converted to a voltage across the resistor (3). When the main current is excessively increased by shorting of the load or the like, this voltage exceeds a prescribed value so that a transistor (5) and a thyristor (7) enter conducting states. Consequently, a voltage across a gate (G) and an emitter (E) of the IGBT (1) is so reduced as to cut off the main current. The transistor (5) prevents the main current from excessive increase since the same has a high speed of response, while the thyristor (7) cuts off the main current to zero since the same has lower resistance in conduction.

28 Claims, 15 Drawing Sheets

F I G. 4
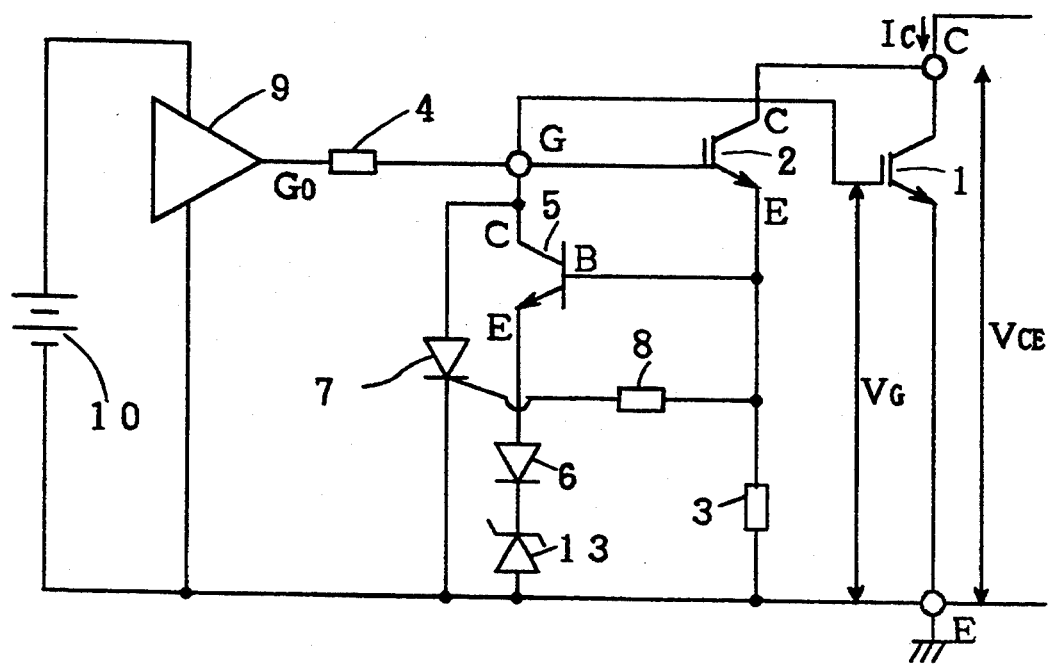

INSULATED GATE SEMICONDUCTOR DEVICE

BACKGROUND OF THE INVENTION

1. Field of the Invention

The present invention relates to an insulated gate semiconductor device which is employed as a switching element in a power converter such as an inverter, and more particularly, it relates to an improvement in a function for preventing an insulated gate element from breakdown in shorting of a load.

2. Description of the Background Art

An insulated gate element such as a MOS field effect transistor element (MOSFET) or an insulated gate bipolar transistor element (IGBT) has two current electrodes and a control electrode which is insulated from these electrodes, so that the value of a current flowing across the two current electrodes is adjusted by the value of a voltage which is applied across the control electrode and one of the current electrodes. The current is increased as the applied voltage is increased, while the same is cut off when the voltage is zero. An insulated gate semiconductor device comprising such an insulated gate element is employed as a switching element for a power converter such as an inverter for switching a current (main current) flowing to a load, for example. When the load is shorted in such a power converter, an excessive main current (short-circuit current) flows to the insulated gate element, which is finally broken if this state is left intact. In the insulated gate semiconductor device, therefore, a driving circuit for the insulated gate element, which is a circuit part for driving the insulated gate element, is provided with a short-circuit current cutoff function for preventing breakdown caused by such a short-circuit current.

FIG. 15 is a block diagram showing an exemplary conventional insulated gate semiconductor device having a short-circuit current cutoff function. A load (not shown) is connected to a collector C of an IGBT 1 serving as an insulated gate element, so that a collector current $I_C$ flowing from the collector C to an emitter E is supplied to the load as a main current. This collector current $I_C$ is controlled by the value of a voltage (gate voltage) across a gate G and the emitter E. A larger collector current $I_C$ flows as the gate voltage is increased. The gate voltage is regulated and supplied by a gate driving circuit 42.

This insulated gate semiconductor device is provided with a current transformer 43, which detects the collector current $I_C$. The as-detected value of the collector current $I_C$ is compared with a prescribed reference value in a compare circuit 44. The compare circuit 44 transmits a prescribed signal to the gate driving circuit 42 when the collector current $I_C$ exceeds the reference value. In response to this signal, the gate driving circuit 42 outputs a prescribed gate voltage to the gate G, in order to cut off the IGBT 1. Thus, the excessive collector current $I_C$ resulting from shorting of the load is cut off to protect the IGBT I against breakdown.

Other exemplary conventional insulated gate semiconductor devices having short-circuit current cutoff functions are disclosed in Japanese Patent Laying-Open Gazettes Nos. 63-318781 (1988), 64-68005 (1989) and 2-309714 (1990). In each of the former two techniques, a second MOSFET is provided in parallel with a first MOSFET for controlling a main current to shunt the main current to the second MOSFET, while a transistor which enters an ON state when the shunt current exceeds a prescribed value is connected between gate and source electrodes of the first and second MOSFETs. When the main current flows in an amount exceeding the prescribed value due to shorting of a load etc., therefore, the transistor is turned on to reduce gate voltages of these MOSFETs, thereby limiting the main current below the prescribed value.

In the last one of the aforementioned conventional techniques, a thyristor is provided in place of the transistor provided in each of the former techniques. When a current which is shunted to a second MOSFET temporarily exceeds a prescribed value and a voltage exceeding a prescribed value is applied across a gate and a cathode of the thyristor, the thyristor so continuously conducts that gate voltages of two MOSFETs are reduced to values close to zero, whereby a main current is continuously cut off.

However, these conventional techniques have the following problems: It is particularly necessary to quickly cut off the short-circuit current when a high voltage is supplied to the load, and hence the gate driving circuit 42 and the compare circuit 44 must be driven at high speeds in the conventional technique shown in FIG. 15. When speeds of these circuits are increased, however, the circuits are liable to cause malfunctions by electrical noises and hence no stable operations can be obtained. Further, circuit loss is increased following such speed increase.

In the prior art of a system of limiting the gate voltages of the MOSFETs with the transistor, it is difficult to sufficiently reduce the gate voltages to values close to zero with the transistor, and hence the short-circuit current cannot be sufficiently cut off in shorting of the load. In the prior art employing a thyristor, on the other hand, the speed of response of the thyristor is so slow as compared with the transistor that a longer time is required for conduction of the thyristor after detection of an excessive main current as compared with the transistor. Therefore, an excessive short-circuit current flows in a constant period when the load is shorted, to break the MOSFETs during this period. Further, an excessive surge voltage is generated by inductance of the load since the current is cut off after a flow of such an excessive short-circuit current, also leading to breakdown of the MOSFETs.

In the prior art, further, the value of an ON-state voltage of the transistor, i.e., the value of a voltage signal which is supplied to the transistor for turning on the transistor, is varied with the temperature of the transistor. Thus, the value of the limited main current is disadvantageously fluctuated depending on the temperature. In the prior art, further, the transistor is erroneously turned on by an electrical noise which is superposed on the aforementioned voltage signal. An influence by such an electrical noise is increased as the speed of a switching operation for the MOSFETs is increased.

SUMMARY OF THE INVENTION

In an aspect of the present invention, an insulated gate semiconductor device comprises (a) a first insulated gate element having a first current electrode, a second current electrode, and a first control electrode which is insulated from the first and second current electrodes, so that a further conducting state is attained between the first and second current electrodes in response to a first voltage which is applied across the first control electrode and the second current electrode with increase of the first voltage, (b) a second insulated gate element having a third current electrode, a fourth current electrode, and a second control electrode which is insulated from the third and fourth current electrodes, so that a further conducting state is attained between the third and fourth current electrodes in response to a second voltage which is applied across the second control electrode and the fourth current electrode with increase of the second voltage, the third current electrode is connected with the first current electrode while the second control electrode is connected with the first control electrode and the fourth current electrode is coupled with the second current electrode, (c) a resistor which is interposed between the second current electrode and the fourth current electrode, (d) gate driving means having an output terminal which is coupled to the first and second control electrodes for outputting a controlled third voltage to the output terminal, (e) a transistor element having a collector electrode, an emitter electrode and a base electrode so that the collector electrode is coupled to the first and second control electrodes, the base electrode is connected to the fourth current electrode and the emitter electrode is coupled with the second current electrode, and (f) a thyristor element having an anode electrode, a cathode electrode and a gate electrode so that the anode and cathode electrodes conduct upon temporary increase of a voltage across the gate and cathode electrodes in excess of a prescribed value while the anode electrode is coupled to the first and second control electrodes, the cathode electrode is connected to the second current electrode and gate electrode is coupled to the fourth current electrode.

In the insulated gate semiconductor device according to the present invention, a load is connected to the first insulated gate element, which adjusts a main current. A part of this main current is shunted to the second insulated gate element. The as-shunted current flows through the resistor, to be converted to a voltage across the resistor. When the main current is excessively increased by shorting of the load or the like, this voltage exceeds a prescribed level so that the transistor and thyristor elements enter conducting states. Consequently, voltages across the first control electrode and the second current electrode as well as across the second control electrode and the fourth current electrode are reduced in the first and second insulated gate elements, whereby these insulated gate elements enter cutoff states to cut off the main current. The transistor prevents the main current from excessive increase in advance since the same has a high speed of response. On the other hand, the thyristor can sufficiently reduce the respective voltages across the first control electrode and the second current electrode as well as across the second control electrode and the fourth current electrode to sufficiently cut off the main current, since the same has lower resistance in conduction than the transistor, although the former has a lower speed of response than the latter.

Preferably, the insulated gate semiconductor device further comprises (g) a first diode which is inserted between the emitter electrode and the second current electrode in such a direction that a current flowing from the collector electrode to the emitter electrode forms a forward current. The first diode has a shorter back recovery time than that between the emitter and base electrodes in the transistor element.

In the insulated gate semiconductor device according to the present invention, the diode having a short back recovery time is connected to the emitter of the transistor element, thereby preventing a malfunction caused by oscillation of the transistor.

Preferably, the insulated gate semiconductor device further comprises (h) a Zener diode which is interposed between the emitter electrode and the second current electrode in such a direction that a current flowing from the collector electrode to the emitter electrode forms a reverse current.

In the insulated gate semiconductor device according to the present invention, the Zener diode is connected to the emitter electrode of the transistor element, whereby the transistor element attains a high ON-state voltage. Therefore, the transistor element has a high margin against an electrical noise superposed on a voltage signal which is supplied to its base electrode. Namely, the transistor element is inhibited from a malfunction caused by such an electrical noise in the inventive semiconductor device. Further, it is possible to compensate for fluctuation of a forward voltage ($V_{BE}$) across the base and emitter electrodes of the transistor element caused by a temperature change, by selecting a Zener diode having proper temperature characteristics. Therefore, it is possible to suppress fluctuation following a temperature change in the level of the main current causing conduction of the transistor element.

Preferably, the gate driving means comprises (d−1) a gate driving part capable of outputting a potential which is lower than that of the second current electrode as the controlled voltage, and the insulated gate semiconductor device further comprises (i) a second diode which is interposed between the first and second control electrodes, the collector electrode and the anode electrode of the thyristor element in a direction for inhibiting a current flowing from the collector electrode toward the first and second control electrodes.

In the insulated gate semiconductor device according to the present invention, the gate driving part can output a potential which is lower than that of the second current electrode of the first insulated gate element, whereby it is possible to sufficiently cut off the first and second insulated gate elements at a high speed. Further, since the diode is provided between the first and second control electrodes and the transistor and the thyristor, a reverse current flowing from the second current electrode of the first insulated gate element toward the first and second control electrodes through the transistor is so blocked that the aforementioned lower potential is correctly transmitted to the first and second control electrodes.

Preferably, the insulated gate semiconductor device further comprises (j) information means which is coupled to the transistor element for informing a fact that the transistor element is in a conducting state.

The insulated gate semiconductor device according to the present invention is provided with the means for informing the conducting state of the transistor element, whereby it is possible to readily recognize a factor stopping the main current.

In another aspect of the present invention, an insulated gate semiconductor device comprises (a) a first insulated gate element having a first current electrode, a second current electrode, and a first control electrode which is insulated from the first and second current electrodes so that a further conducting state is attained between the first and second current electrodes in response to a first voltage which is applied across the first control electrode and the second current electrode with increase of the first voltage, (b) a second insulated gate element having a third current electrode, a fourth current electrode, and a second control electrode which is insulated from the third and fourth current electrodes so that a further conducting state is attained between the third and fourth current electrodes in response to a second voltage which is applied across the second control electrode and the fourth current electrode with increase of the second voltage while the third current electrode is connected with the first current electrode, the second control electrode is connected with the first control electrode and the fourth current electrode is coupled with the second current electrode, (c) current detection means which has a voltage output terminal and is interposed between the second and fourth current electrodes for detecting a current passing through the second insulated gate element and flowing through the third and fourth current electrodes, for outputting a voltage corresponding to the current from the voltage output terminal, (d) gate driving means having an output terminal which is coupled to the first and second control electrodes, for outputting a controlled third voltage to the output terminal, (e) a MOS field effect transistor element having a fifth current electrode, a sixth current electrode, and a third control electrode so that the fifth current electrode is coupled to the first and second control electrodes, the third control electrode is coupled to the voltage output terminal and the sixth current electrode is coupled to the second current electrode, and (f) a Zener diode which is interposed between the sixth current electrode and the second current electrode in such a direction that a current passing through the MOS field effect transistor element and flowing across the fifth and sixth current electrodes in a forward direction forms a reverse current.

In the insulated gate semiconductor device according to the present invention, the load is connected to the first insulated gate element, which adjusts the main current. A part of this main current is shunted to the second insulated gate element. The as-shunted current is converted by the current detection means to a voltage having a value corresponding to that of the current. When the main current is excessively increased by shorting of the load or the like, this voltage exceeds a prescribed ON-state voltage, whereby the MOS field effect transistor element enters a conducting state. Consequently, the respective voltages across the first control electrode and the second current electrode as well as across the second control electrode and the fourth current electrode are reduced in the first and second insulated gate elements, whereby these insulated gate elements enter states approximate to cutoff states, to inhibit the main current from increase beyond a prescribed limit. Since the Zener diode is connected in series with the sixth current electrode of the MOS field effect transistor element, the ON-state voltage of the MOS field effect transistor element is increased by a level corresponding to the Zener voltage of the Zener diode. Therefore, the MOS field effect transistor element has a high margin against an electrical noise superposed on a voltage signal which is supplied to its third control electrode. Namely, the MOS field effect transistor element is inhibited from a malfunction caused by such an electrical noise in the inventive semiconductor device.

Preferably, a Zener voltage in the Zener diode has complementary temperature characteristics with respect to channel temperature characteristics of a gate-source threshold voltage in the MOS field effect transistor element.

In the insulated gate semiconductor device according to the present invention, selected and employed is the Zener diode having a Zener voltage whose temperature characteristics are complementary with those of the gate-source threshold voltage of the MOS field effect transistor. Namely, temperature dependence of the Zener voltage and that of the gate-source threshold voltage compensate for each other, whereby the total sum thereof will not depend on the temperature. Thus, the ON-state voltage of the MOS field effect transistor element will not depend on the temperature. Thus, it is possible to suppress fluctuation of the value of the main current, causing conduction of the MOS field effect transistor element, following a temperature change.

Preferably, the current detection means comprises (c−1) a first resistor which is interposed between the second and fourth current electrodes so that an end of the first resistor is coupled to the fourth current electrode serving as the voltage output terminal.

In the insulated gate semiconductor device according to the present invention, a resistor is employed as the current detection means. The current flowing in the second insulated gate element so flows through this first resistor as to develop a voltage which is proportionate to the current across the first resistor. This voltage is supplied to the third control electrode of the MOS field effect transistor element. Namely, the current detection means can be simply formed according to this semiconductor device, to reduce the cost required for the structure of the device. Further, the current is converted to the voltage at a high speed of response. Further, it is possible to readily set such conversion in high accuracy by selecting a resistor having high accuracy of its resistance value.

Preferably, the MOS field effect transistor element comprises (c−1) a plurality of unit MOS field effect transistor elements having seventh current electrodes, eighth current electrodes and fourth control electrodes so that the seventh current electrodes, the eighth current electrodes and the fourth control electrodes in the plurality of unit MOS field effect transistor elements are so mutually connected that the seventh current electrodes, the eighth current electrodes and the fourth control electrodes serve as the fifth current electrode, the sixth current electrode, and the third control electrode respectively.

In the insulated gate semiconductor device according to the present invention, a plurality of MOS field effect transistor elements are connected in parallel with each other, to exhibit low resistance values upon conduction. In a semiconductor device corresponding to a high main current, the driving means is set at low output resistance in order to cut off the first and second insulated gate elements at a high speed. According to the inventive semiconductor device, it is possible to sufficiently reduce the respective voltages across the first control electrode and the second current electrode as well as across the second control electrode and the fourth current electrode even if the driving means has low output resistance, since the MOS field effect transistor elements have low resistance values. Namely, this semiconductor device can control a high main current at a high speed, while sufficiently inhibiting the main current from excessive increase.

Preferably, the insulated gate semiconductor device further comprises (g) a light emitting diode which is coupled to the MOS field effect transistor, and this light emitting diode is interposed in such a direction that a current passing through the MOS field effect transistor element and flowing across the fifth and sixth current electrodes in a forward direction forms a forward current.

In the insulated gate semiconductor device according to the present invention, the light emitting diode is coupled in series to the MOS field effect transistor. Upon conduction of the MOS field effect transistor element, therefore, the current flowing therein simultaneously flows in the light emitting diode. Consequently, the light emitting diode emits light in conduction of the MOS field effect transistor. Namely, it is possible to readily recognize whether the inventive semiconductor device is in a normally operating state or an abnormally operating state from the emission of the light emitting diode.

Preferably, the gate driving means comprises (d−1) a gate driving part capable of outputting a voltage corresponding to a potential which is lower than that of the second current electrode as the controlled third voltage, and the insulated gate semiconductor device further comprises (g) a first diode which is interposed between the first and second control electrodes and the fifth current electrode in such a direction that a current passing through the MOS field effect transistor element and flowing across the fifth and sixth current electrodes in a forward direction forms a forward current.

In the insulated gate semiconductor device according to the present invention, the gate driving part can output a potential which is lower than that of the second current electrode of the first insulated gate element, whereby the first and second insulated gate elements can be sufficiently cut off at a high speed. Since the first diode is provided between the first and second control electrodes and the MOS field effect transistor element, it is possible to block a reverse current flowing from the second current electrode of the first insulated gate element toward the first and second control electrodes through the MOS field effect transistor element, whereby the aforementioned low potential is correctly transmitted to the first and second control electrodes.

Preferably, the first diode is a light emitting diode.

In the insulated gate semiconductor device according to the present invention, the first diode which is coupled in series to the MOS field effect transistor element is formed by a light emitting diode. Upon conduction of the MOS field effect transistor element, therefore, the light emitting diode emits light. Namely, it is possible to implement both of inhibition of a reverse current and information of an abnormal operation by a simple structure according to this semiconductor device.

Preferably, the insulated gate semiconductor device further comprises (h) a second resistor which is interposed between the third control electrode and the voltage output terminal.

In the insulated gate semiconductor device according to the present invention, the second resistor is provided between the third control electrode of the MOS field effect transistor element and the voltage output terminal of the current detection means, whereby it is possible to prevent the device from an oscillating phenomenon.

Preferably, the insulated gate semiconductor device further comprises (i) a second diode which is connected in parallel with the second resistor and interposed between the third control electrode and the voltage output terminal in a direction capable of transmitting a voltage, which is outputted from the voltage output terminal to shift the MOS field effect transistor element from a cutoff state to a conducting state, to the third control electrode in a shorted state of the second diode.

In the insulated gate semiconductor device according to the present invention, the second diode is connected in parallel with the second resistor. Therefore, the voltage signal which is fed from the current detection means for turning on the MOS field effect transistor element is transmitted to the third control electrode of the MOS field effect transistor element with a short delay time. Namely, an excessive main current is suppressed in a short time according to this semiconductor device since the MOS field effect transistor element is responsive to the excessive main current at a high speed.

Preferably, at least the MOS field effect transistor element, the Zener diode, the second resistor and the second diode are integrated on a single semiconductor chip.

In the insulated gate semiconductor device according to the present invention, the MOS field effect transistor element and the circuit parts which are coupled thereto are integrated on a single semiconductor chip. Therefore, the semiconductor device is simple to assemble. Further, it is possible to form the device in high reproducibility so that the temperature characteristics of the MOS field effect transistor element and the Zener diode are complementary to each other. In addition, the temperatures of these elements are made further homogeneous, so that the ON-state voltage has further excellent non-dependence on the temperature. Further, the first resistor can be omitted from the integrated circuit. In this case, it is possible to cope with various designs of the semiconductor device by properly selecting the first resistance through the same integrated circuit.

According to still another aspect of the present invention, an insulated gate semiconductor device comprises (a) a first insulated gate element having a first current electrode, a second current electrode, and a first control electrode which is insulated from the first and second current electrodes so that a further conducting state is attained between the first and second current electrodes in response to a first voltage which is applied across the first control electrode and the second current electrode with increase of the first voltage, (b) a second insulated gate element having a third current electrode, a fourth current electrode, and a second control electrode which is insulated from the third and fourth current electrodes so that a further conducting state is attained between the third and fourth current electrodes in response to a second voltage which is applied across the second control electrode and the fourth current electrode with increase of the second voltage while the third current electrode is connected with the first current electrode, the second control electrode is connected with the first control electrode and the fourth current electrode is coupled with the second current electrode, (c) a first junction field effect transistor element which is interposed between the second and fourth current electrodes and having a fifth current electrode, a sixth current electrode, and a third control electrode so that the fifth current electrode is connected to the fourth current electrode, the sixth current electrode is coupled to the second current electrode and the third control electrode is coupled to the fourth current electrode, (d) a first resistor which is interposed between the sixth current electrode and the second current electrode, (e) gate driving means having an output terminal which is coupled to the first and second control electrodes, for outputting a controlled third voltage to the output terminal, (f) a second junction field effect transistor element having a seventh current electrode, an eighth current electrode, and a fourth control electrode so that the seventh current electrode is coupled to the first and second control electrodes, the fourth control electrode is coupled to the third control electrode and the eighth current electrode is coupled to the second current electrode, and (g) a second resistor which is interposed between the eighth current electrode and the second current electrode.

In the insulated gate semiconductor device according to the present invention, the load is connected to the first insulated gate element, which adjust the main current. A part of this main current is shunted to the second insulated gate element. The as-shunted current flows through the series circuit of the first junction field effect transistor element and the first resistor. A negative-feedback current mirror circuit is formed by the first and second junction field effect transistor elements and the first and second resistors. Therefore, a current which is proportionate to the aforementioned shunted current flows to the second junction field effect transistor. Its proportional constant is determined by the ratio of the resistance value of the first resistor to that of the second resistor, with small fluctuation following a temperature change. The seventh current electrode of the second junction field effect transistor element is coupled to the control electrodes of the first and second insulated gate elements, whereby the potentials of the control electrodes of the first and second insulated gate elements are reduced at a degree corresponding to the aforementioned current which is shunted to the second insulated gate element. Namely, a function for suppressing an overcurrent is implemented in high accuracy corresponding to those of the resistance values of the two resistors according to the inventive semiconductor device, while the function does not much depend on the temperature.

Accordingly, an object of the present invention is to provide an insulated gate semiconductor device which limits an excessive main current at a high speed and cuts off the same to a level close to zero. Another object of the present invention is to provide an insulated gate semiconductor device which has no possibility of a malfunction caused by an electrical noise, with no fluctuation in characteristics caused by a temperature.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a circuit diagram showing the structure of a semiconductor device according to a second embodiment of the present invention;

DESCRIPTION OF THE PREFERRED EMBODIMENTS

<1. Embodiment 1>

<1—1. Structure of Device>

Figure 1:
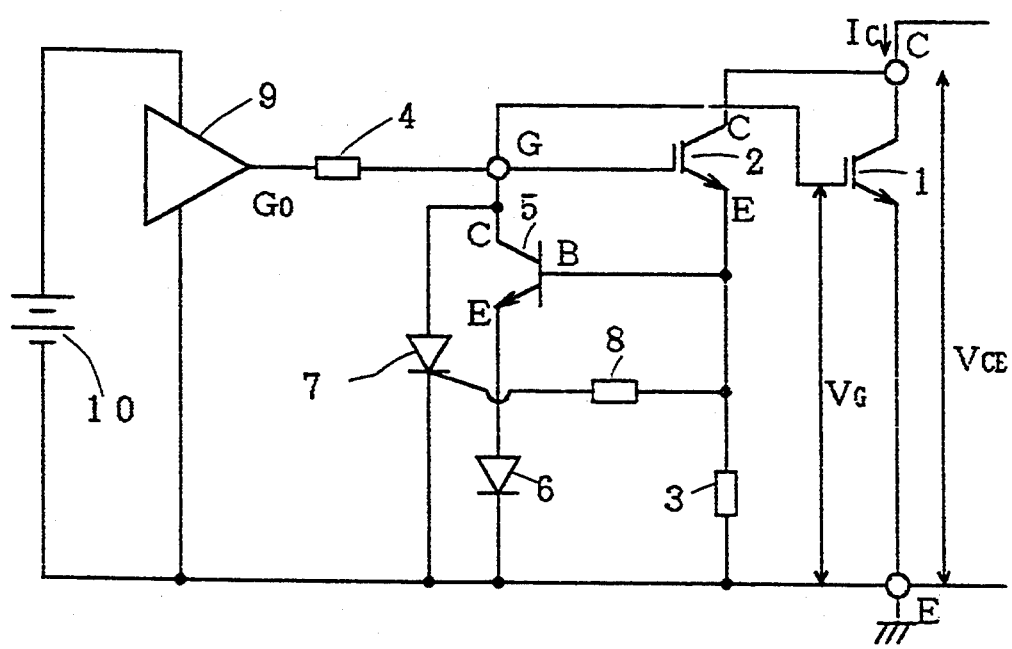
FIG. 1 is a circuit diagram showing a semiconductor device according to a first embodiment of the present invention.

FIG. 1 is a circuit diagram showing a first embodiment of the present invention. A load (not shown) is connected to a collector C (first current electrode) of an IGBT 1 (first insulated gate element), so that a collector current $I_C$ mainly flowing from the collector C to an emitter E (second current electrode) is supplied to the load as a main current. This collector current $I_C$ is controlled by the value of agate voltage across a gate G (control electrode) and the emitter E. A higher collector current $I_C$ flows as the gate voltage is increased. This gate voltage is regulated and supplied by a gate driving circuit 9 (gate driving means). A resistor 4 is interposed between an output terminal $G_O$ of the gate driving circuit 9 and the gate G. A power source 10 which is connected to the gate driving circuit 9 supplies a source voltage to the gate driving circuit 9.

Another IGBT 2 (second insulated gate element) having lower current capacity than the IGBT 1 is provided in parallel with the IGBT 1. The collectors C and the gates G of the IGBTs 1 and 2 are connected with each other. A part of the main current which is supplied to the load is shunted to the IGBT 2 as a collector current $I_C$ for the IGBT 2. A resistor 3 is connected between the emitters E of the IGBTs 2 and 1. The current which is shunted to the IGBT 2 passes through the resistor 3. Therefore, a voltage which is proportionate to the shunted current is developed across the resistor 3. Therefore, a higher voltage is developed across the resistor 3 as the main current is increased.

A transistor 5 and a thyristor 7 are interposed between the gate G and the emitter E of the IGBT I. A collector C of the transistor 5 and an anode of the thyristor 7 are connected to the gate G, while a base B of the transistor 5 is connected between the emitter E of the IGBT 2 and the resistor 3. An emitter E of the transistor 5 is connected to the emitter E of the IGBT 1 through a Schottky-barrier diode 6 (first diode). The Schottky-barrier diode 6 is connected in such a direction that a current flowing from the collector C to the emitter E of the transistor 5 forms a forward current. A cathode of the thyristor 7 is connected to the emitter E of the 1GBT 1, while its gate is connected between the emitter E of the IGBT 2 and the resistor 3 through a resistor 8.

<1-2. Operation of Device>

While the main current is at a low value within a range of a normal operation, the voltage developed across the resistor 3 is so sufficiently low that a voltage ($V_{BE}$) across the base B and the emitter E of the transistor 5 is insufficient for bringing the transistor 5 into an ON (conducting) state and that across the gate and the cathode of the thyristor 7 is also insufficient for bringing the thyristor 7 into an ON state. Therefore, both of the transistor 5 and the thyristor 7 are in OFF (cutoff) states. At this time, the potential of the gate G coincides with that outputted from the gate driving circuit 9. In other words, the IGBTs 1 and 2 operate in response to the output potential of the gate driving circuit 9.

When the main circuit is increased beyond the range of a normal operation by shorting of the load or the like, on the other hand, the voltage across the resistor 3 is increased in response. As the result, the base-to-emitter voltage $V_{BE}$ of the transistor 5 is so increased as to turn on the transistor 5, while the gate-to-cathode voltage of thyristor 7 is also so increased as to turn on the thyristor 7. Thus, the transistor 5 immediately enters an ON state, to reduce the potential of the gate G to some extent. Then the thyristor 7 enters an ON state in a short delay to reduce the potential of the gate G to a level substantially equal to that of the emitter E of the IGBT 1, whereby the IGBTs 1 and 2 enter cutoff states so that the main current finally reaches zero. Thus, the IGBT 1 is protected against breakdown. The resistance value of the resistor 3 is properly selected in correspondence to setting of an upper limit of the normal operation range of the main current.

The Schottky-barrier diode 6 is provided in order to prevent the semiconductor device from oscillation. Since this Schottky-barrier diode 6 has a shorter back recovery time than that in junction between the base B and the emitter E of the transistor 5, it is possible to prevent the circuit from oscillation by providing this Schottky-barrier diode 6 as shown in FIG. 1.

<1-3. Observation Data>

Figure 2:
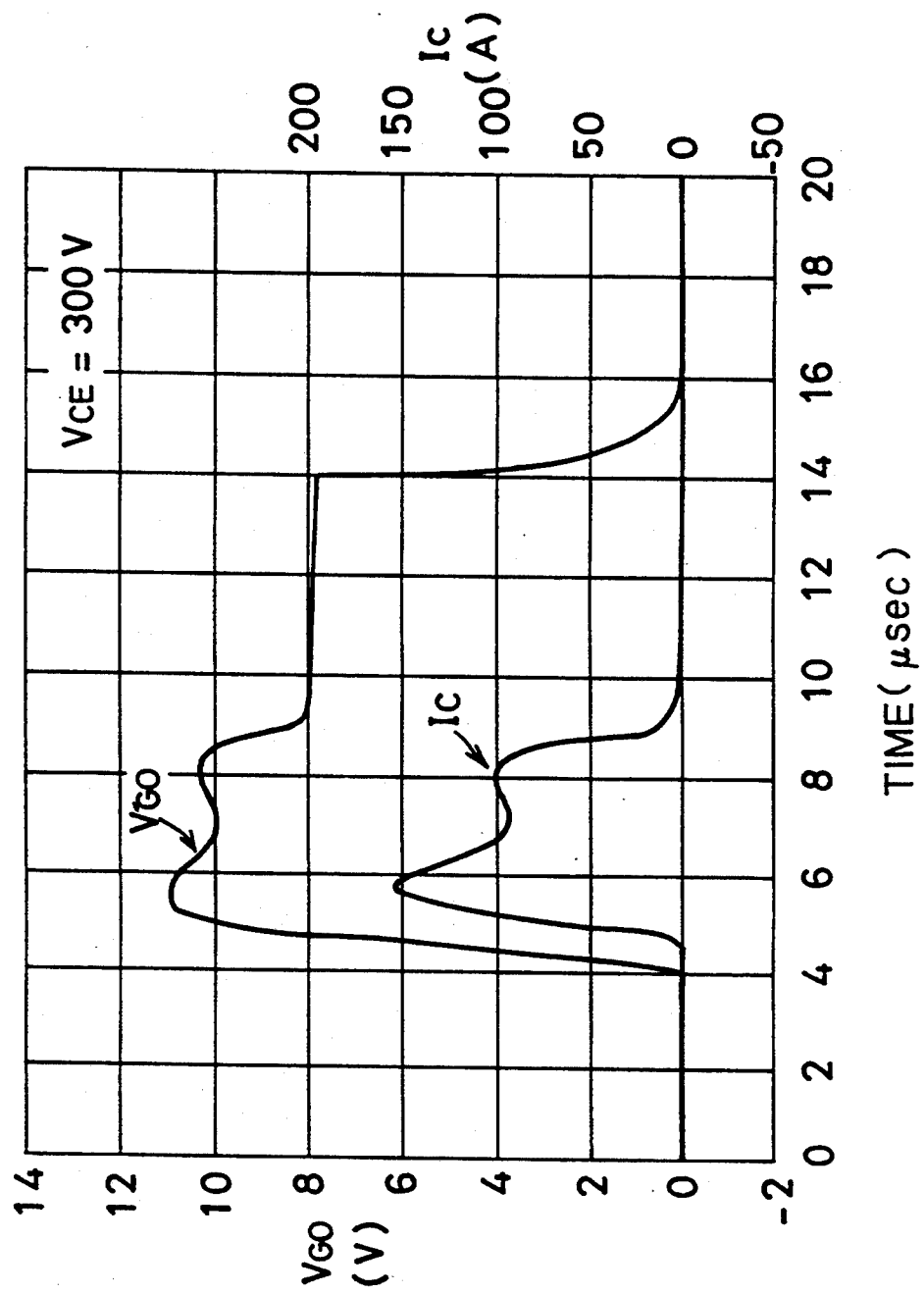
FIG. 2 is a graph showing results of observation in relation to the semiconductor device according to the first embodiment.

FIG. 2 is a graph showing observation results in relation to the insulated gate semiconductor device according to this embodiment. Referring to FIG. 2, the axis of ordinates corresponds to a voltage $V_{GO}$ across the output terminal $G_O$ of the gate driving circuit 9 and the emitter E of the IGBT 1, and the main current (substantially corresponding to the collector current $I_C$ for the IGBT 1), while the axis of abscissas corresponds to time. A rated value of the voltage $V_{CE}$ across the collector C and the emitter E of the IGBT 1 is 600 V in this semiconductor device, and a half voltage of 300 V is applied in the observation. When the output terminal voltage $V_{GO}$ is abruptly raised from zero to about 10 V, which is a sufficient value for allowing conduction of the IGBT 1, the collector current $I_C$ is first increased in response thereto. However, the collector current $I_C$ is not unlimitedly increased but restricted to a value around 100 A since the transistor 5 is turned on. Thereafter the thyristor 7 is turned on in a slight delay, whereby the voltage $V_G$ across the gate G and the emitter E of the IGBT 1 is reduced substantially to zero. The output terminal voltage $V_{GO}$ is reduced to 8 V at around 9 $\mu$sec. for this reason. The width of reduction of the output terminal voltage $V_{GO}$ reflects a ratio of the resistor 4 to output resistance of the gate driving circuit 9. The IGBTs 1 and 2 are cut off when the thyristor 7 is turned on, whereby the main current reaches zero as understood from FIG. 2. When the time reaches 14 $\mu$sec., the output terminal voltage $V_{GO}$ is returned to zero to complete observation.

Figure 3:
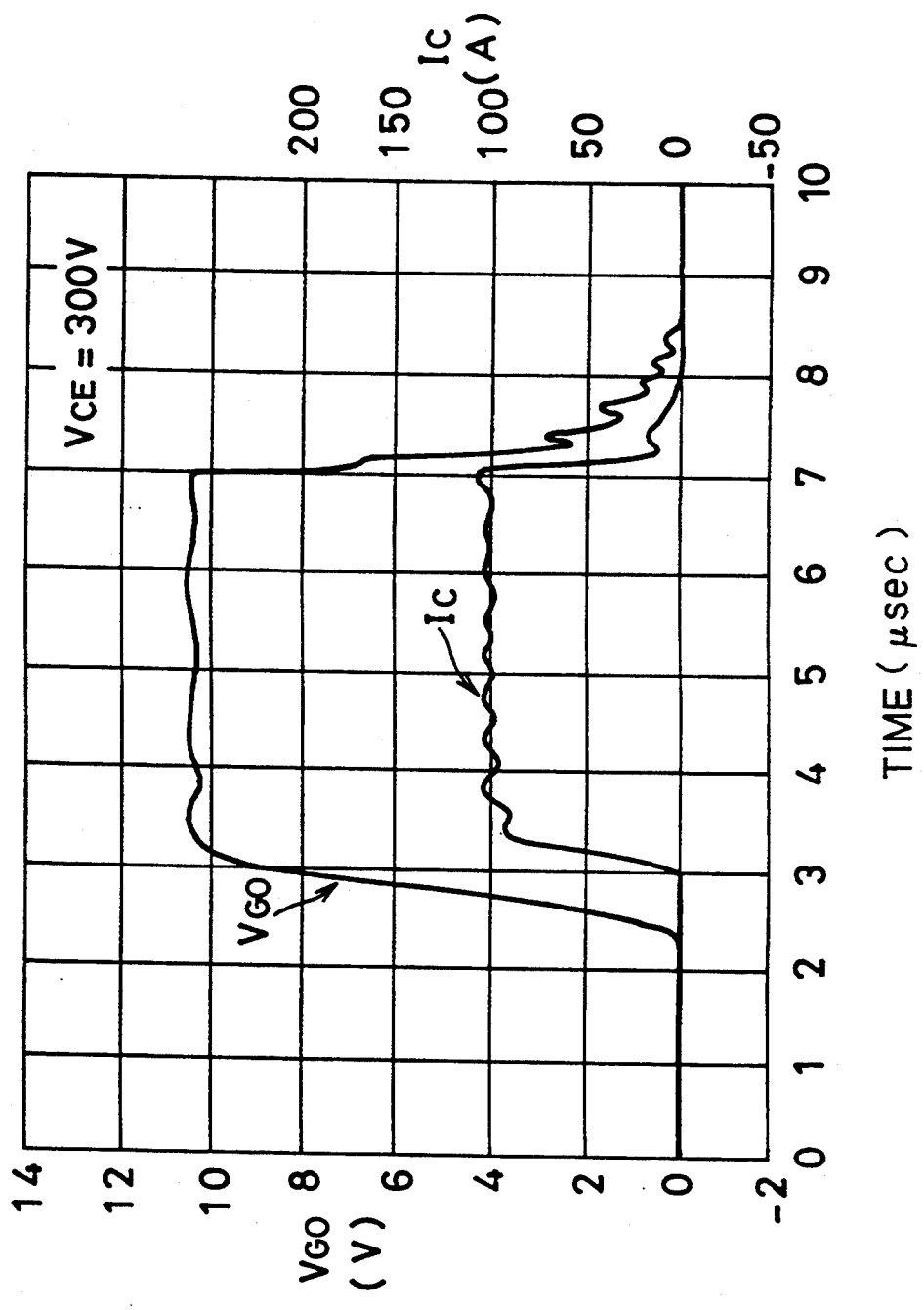
FIG. 3 is a graph showing results of observation in relation to a circuit to be compared with the semiconductor device according to the first embodiment.

FIG. 3 is a graph showing results of observation similar to that in FIG. 2, in relation to a circuit having such a structure that the thyristor 7 is removed from the semiconductor device according to this embodiment. In this case, the main current is limited to a value of about 100 A after rise of the output terminal voltage $V_{GO}$ by action of the transistor 5, similarly to the result shown in FIG. 2. However, the main current maintains a value of about 100 A up to a time of 7 $\mu$sec. when the output terminal voltage $V_{GO}$ is returned to zero. Namely, the main current continuously maintains a considerably high value even if abnormality is caused in the load at such a degree that the main current is increased beyond a range of a normal operation. In this circuit structure, therefore, the IGBT 1 may be broken in abnormality such as shorting of the load.

In another circuit (not shown) having such a structure that the thyristor 7 is left but the transistor 5 is removed from the semiconductor device according to this embodiment shown in FIG. 1, the thyristor 7 is turned on to reduce the main current to zero after a lapse of a constant time from rise of the output terminal voltage $V_{GO}$, as readily predicted from the observation results shown in FIG. 2. However, the main current runs away to a value extremely higher than that of about 100 A shown in FIG. 2, since no mechanism is provided for limiting the main current in a period before the turn-on time of the thyristor 7. The IGBT I may be broken such an abnormally high runaway main current. After a lapse of the constant time, the main current is abruptly reduced to zero from the abnormally high runaway current level since the thyristor 7 is turned on. Consequently, a high surge voltage is developed across the collectors and the emitters of the IGBTs 1 and 2 by inductance provided in the load or that parasitically generated in a line of the load. This surge voltage further breaks the IGBTs 1 and 2.

However, the semiconductor device of this embodiment shown in FIG. 1 comprises both of the transistor 5 and the thyristor 7, whereby increase of the main current is quickly suppressed to a certain limit when the main current is abnormally increased beyond the normal operation range in shorting of the load or the like. Further, the main current is reduced to zero after the constant period, whereby the IGBT 1 is prevented from breakdown caused by an excessive collector current $I_C$. Since the main current is inhibited from unlimited increase, it is possible to suppress a surge voltage which is developed when the thyristor 7 is turned on. Thus, the IGBT 1 is prevented from breakdown which is caused by application of an excessively high collector-to-emitter voltage $V_{CE}$ across the IGBTs 1 and 2.

<2. Embodiment 2>

FIG. 4 is a circuit diagram showing the structure of a semiconductor device according to a second embodiment of the present invention. According to this embodiment, a Zener diode 13 is connected to an emitter E of the transistor 5 in series with a Schottky-barrier diode 6. The Zener diode 13 is set in such a direction that a current flowing from a collector C to the emitter E of the transistor 5 forms a reverse current. A base-to-emitter voltage $V_{BE}$ of the transistor 5 is varied with a temperature change. Therefore, the voltage across the resistor 3 for turning on the transistor 5 is fluctuated in the semiconductor device according to the embodiment 1, whereby the value of the main current for turning on the transistor 5 is fluctuated. A reverse voltage (Zener voltage) of the Zener diode 13 is increased following a temperature increase, contrarily to the base-to-emitter voltage $V_{BE}$. When a proper Zener diode 13 is selected and set as shown in FIG. 4, therefore, it is possible to maintain the voltage across the resistor 3 for turning on the transistor 5 at a constant value with no dependence on a temperature change.

<3. Embodiment 3>

Figure 5:
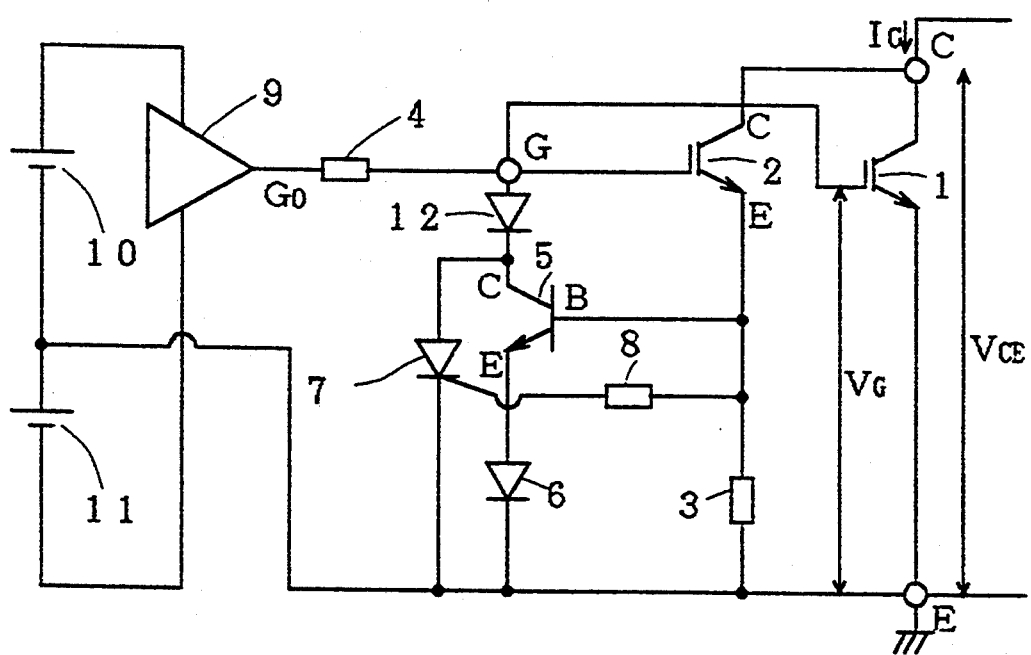
FIG. 5 is a circuit diagram showing the structure of a semiconductor device according to a third embodiment of the present invention.

FIG. 5 is a circuit diagram showing the structure of a semiconductor device according to a third embodiment of the present invention. This embodiment is so structure that a reverse voltage is applied across a gate G and an emitter E of an IGBT 1, in order to increase a speed of response for turning off the IGBT 1. Thus, a reverse bias power source 11 is connected to a gate driving circuit 9, in addition to a power source 10. Further, a diode 12 (second diode) is so provided that a potential at the emitter E of the IGBT 1 will not increase that of the gate G through a resistor 3 and a transistor 5, to prevent a gate-to-emitter voltage $V_G$ from reaching a value around zero. The diode 12 is interposed between the gate G and the collector C of the transistor 5 and an anode of a thyristor 7, to prevent a reverse current which flows from the emitter E of the IGBT 1 toward the gate G through the resistor 3 and the transistor 5.

<4. Embodiment 4>

Figure 6:
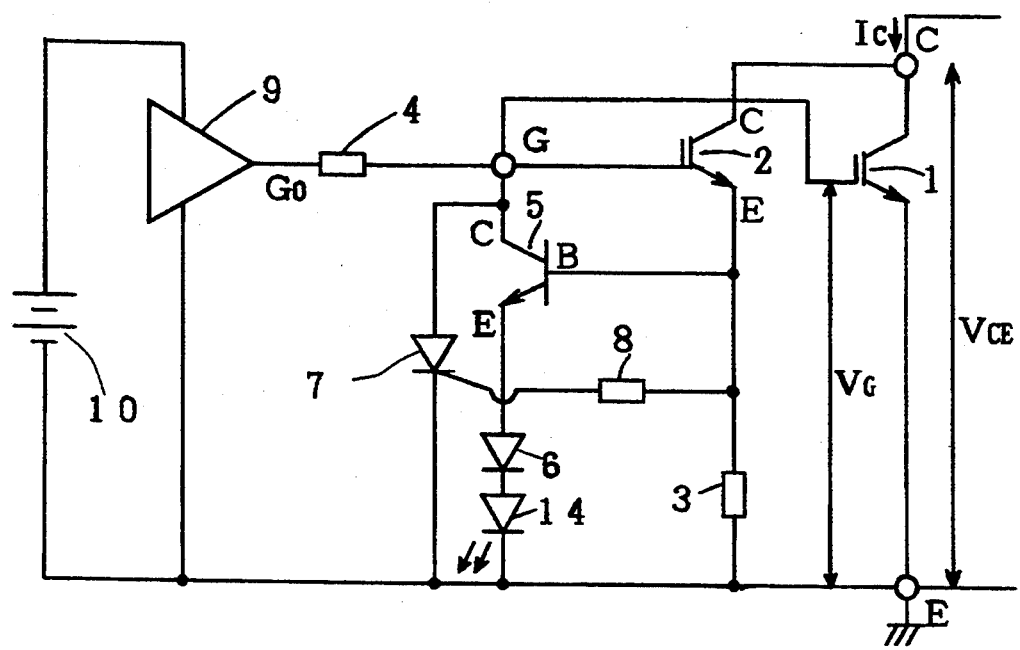
FIG. 6 is a circuit diagram showing the structure of a semiconductor device according to a fourth embodiment of the present invention.

FIG. 6 is a circuit diagram showing the structure of a semiconductor device according to a fourth embodiment of the present invention. According to this embodiment, a light emitting diode 14 (information means) is interposed between emitters E of a transistor 5 and an IGBT 1. The light emitting diode 14 is set in such a direction that a current flowing from a collector C to the emitter E of the transistor 5 forms a forward current of the light emitting diode 14. The light emitting diode 14 emits light when the transistor 5 is turned on. Thus, it is possible to recognize an operating state of the transistor 5 caused by abnormal increase of a main current resulting from shorting of a load or the like by such light emission. In other words, it is possible to readily recognize upon stopping of the main current whether the same is normally stopped or stopped by occurrence of abnormality.

<5. Embodiment 5>

In each of the aforementioned embodiments, the transistor 5, the thyristor 7 and the resistor 3 may be formed in a single semiconductor chip. Further, the resistor 8, the Schottky-barrier diode 6, the Zener diode 13 and the like may additionally formed in the single semiconductor chip.

<6. Embodiment 6>

<6-1. Structure of Device>

Figure 7:
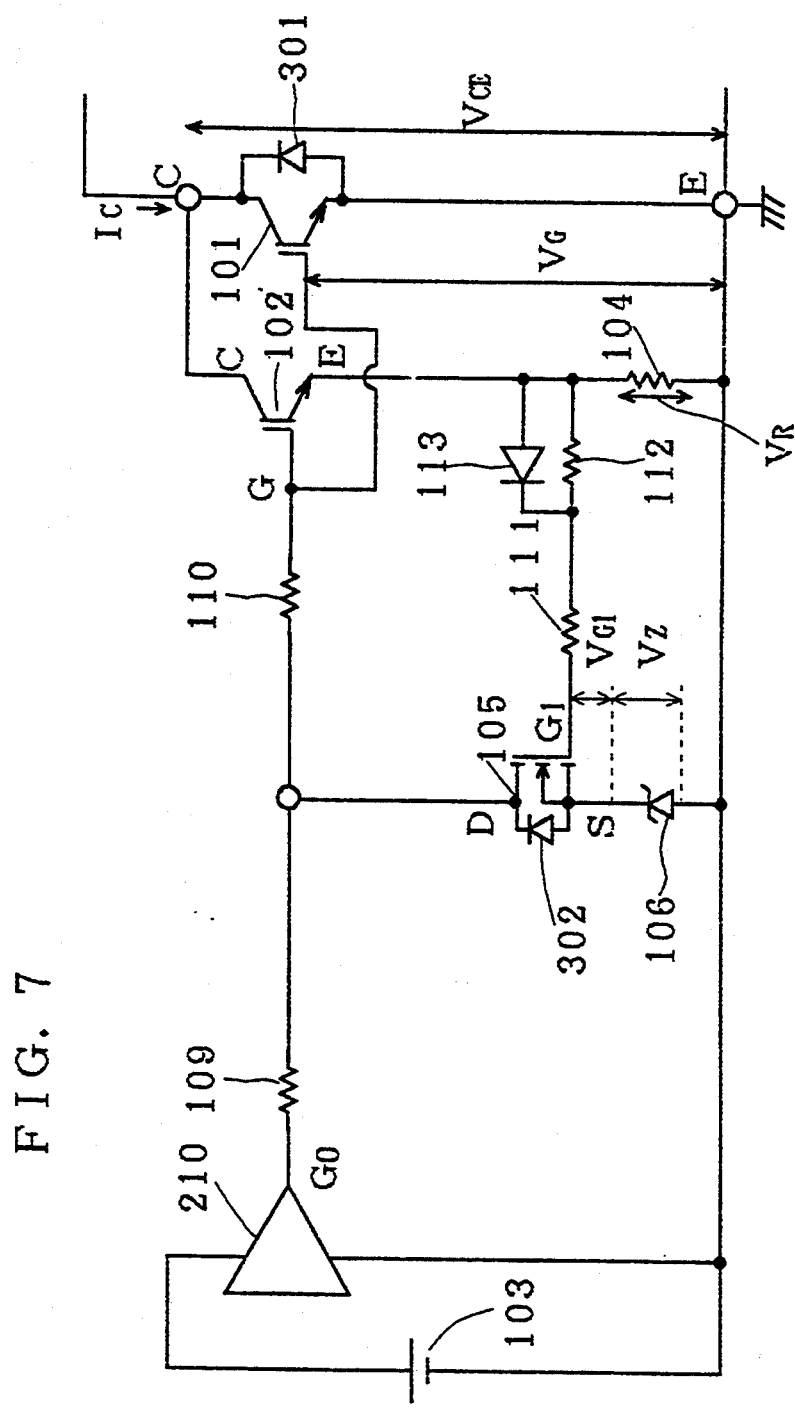
FIG. 7 is a circuit diagram showing the structure of a semiconductor device according to a sixth embodiment of the present invention.

FIG. 7 is a circuit diagram showing the structure of a semiconductor device according to a sixth embodiment of the present invention. A load (not shown) is connected to a collector C (first current electrode) of an IGBT 101 (first insulated gate element), so that a collector current $I_C$ mainly flowing from the collector C to an emitter E (second current electrode) is supplied to the load as a main current. This collector current $I_C$ is controlled by a value of a gate-to-emitter voltage $V_G$, which is a voltage across a gate G (control electrode) and the emitter E. A higher collector current $I_C$ flows as the gate-to-emitter voltage $V_G$ is increased. The gate-to-emitter voltage $V_G$ is regulated and supplied by a gate driving circuit 210 (gate driving means). A resistor 109 is interposed between an output terminal $G_O$ of the gate driving circuit 210 and the gate G. A power source 103 which is connected to the gate driving circuit 210 supplies a source voltage to the gate driving circuit 210.

Another IGBT 2 (second insulated gate element) having lower current capacity than the IGBT 101 is provided in parallel with the IGBT 101. The collectors C and the gates G of the IGBTs 1 and 2 are connected with each other. A small part of the main current which is supplied to the load is shunted to the IGBT 102 as a collector current $I_C$ for the IGBT 102. A resistor 104 is connected between the emitters E of the IGBTs 102 and 101. The current which is shunted to the IGBT 102 passes through the resistor 104. Therefore, a voltage $V_R$ which is proportionate to the shunted current is developed across the resistor 104. Thus, a higher voltage $V_R$ is developed across the resistor 104 as the main current is increased.

A series circuit of a MOS field effect transistor element (hereinafter referred to as MOSFET) 105 and a Zener diode 106 is interposed in parallel between the gate G and the emitter E of the IGBT 101. A drain D of the MOSFET 105 is connected to the gate G through a resistor 110. This drain D is also connected to an end of the resistor 109. A cathode of the Zener diode 106 is connected to a source S of the MOSFET 105. An anode of the Zener diode 106 is connected to the emitter E of the IGBT 101. Namely, the Zener diode 106 is set in such a direction that a current flowing from the drain D to the source S of the MOSFET 105 forms a reverse current of the Zener diode 106.

A gate G1 of the MOSFET 105 is coupled to the emitter E of the IGBT 102 through resistors 111 and 112 and a diode 113. The resistors 111 and 112 are connected in series with each other, while the diode 113 is connected in parallel with the resistor 112. The diode 113 is interposed in such a direction that its anode is connected to the emitter E of the IGBT 102.

The IGBT 101 is connected in parallel with a freewheel diode 301 for preventing breakdown caused by a reverse voltage which is developed across the collector C and the emitter E when this element is converted from a conducting state to a cutoff state. Similarly, the MOSFET 105 is connected in parallel with a freewheel diode 302 which is adapted to protect the MOSFET 105.

<6-2. Schematic Operation of Device>

The MOSFET 105 enters an OFF state when a gate-to-source voltage $V_{G1}$ across the gate G1 and the source S is lower than a gate threshold voltage (a gate-source threshold voltage) $V_{GS(th)}$ which is specific to the MOSFET 105, while the same enters an ON state when the former is higher than the latter. Therefore, the MOSFET 105 enters an OFF state when a voltage $V_R$ developed across the resistor 114 is lower than the sum of a Zener voltage $V_Z$ which is specific to the Zener diode 106 and the gate threshold voltage $V_{GS(th)}$ of the MOSFET 105 while the same enters an ON state in other case. While the main current is at a low value within a range of a normal operation, the voltage $V_R$ is sufficiently low as compared with the sum of the Zener voltage $V_Z$ and the gate threshold voltage $V_{GS(th)}$. Therefore, the MOSFET 105 is in an OFF state. At this time, the potential of the gate G coincides with a potential which is outputted from the gate driving circuit 210. In other words, the IGBTs 101 and 102 operate in response to the output potential of the gate driving circuit 210.

When the main current is increased beyond the range of the normal operation by shorting of the load or the like, on the other hand, the voltage $V_R$ is also increased in response to the same. When the main current is so increased that the voltage $V_R$ exceeds the sum of the Zener voltage VZ and the gate threshold voltage $V_{GS(th)}$, the MOSFET 105 enters an ON state. Consequently, the potential of the gate G is reduced. Thus, the IGBTs 101 and 102 enter states close to cutoff states, whereby increase of the main current is prevented. Namely, this semiconductor device prevents the main current from being increased beyond an upper limit corresponding to coincidence of the voltage $V_R$ to the sum of the Zener voltage VZ and the gate threshold voltage $V_{GS(th)}$. As the result, the IGBT 101 is prevented from breakdown caused by an overcurrent. The resistance value of the resistor 104 is properly selected in correspondence to the upper limit of the main current which is set within the range of the normal operation.

<6-3. Characteristic Operation of Device>

The resistor 104 may be replaced by another current detection circuit which detects the collector current $I_C$ of the IGBT 102 and outputs a voltage corresponding to the collector current $I_C$. According to this embodiment forming a current detection circuit by the resistor 104, however, it is possible to most simply form a semiconductor device at the lowest cost. The resistor 104 converts the collector current $I_C$ to the voltage $V_R$ at a high speed. Further, it is possible to readily set accuracy of conversion from the collector current $I_C$ to the voltage $V_R$ at a high level by selecting a resistor having high accuracy for the resistor 104. Namely, this embodiment is excellent in accuracy of the current detection circuit and high speed responsibility, with a simple structure.

According to this semiconductor device, the Zener diode 106 is provided in series to the MOSFET 105. In this semiconductor device, therefore, the voltage $V_R$ which is required for turning on the MOSFET 105 is higher by the Zener voltage VZ as compared with a conventional semiconductor device having no Zener diode 106. Thus, it is possible to suppress such a malfunction that the MOSFET 105 is erroneously turned on by an electrical noise superposed on the voltage signal which is inputted in the gate G1. Namely, this semiconductor device has a higher noise margin as compared with the conventional device.

According to this embodiment, the resistors 112 and 111 are interposed in a line for transmitting the voltage $V_R$ to the gate G1. Thus, the semiconductor device is prevented from oscillation.

According to this embodiment, further, the diode 113 is provided in parallel with the resistor 112. This diode 113 is set in such a direction that the voltage $V_R$ is transmitted to the gate G1 along the forward direction of the diode 113. Therefore, the voltage $V_R$ is transmitted to the gate G1 in a short time when the resistor 104 transmits the voltage $V_R$ in order to convert the operation of the MOSFET 105 from an OFF state to an ON state. Namely, the diode 113 has a function of accelerating the conversion of the MOSFET 105 from an OFF state to an ON state. Thus, it is possible to reduce a delay time required for restricting the main current to a value below the upper limit value after shorting of the load.

<Embodiment 7>

In the semiconductor device according to the embodiment 6, the gate threshold voltage $V_{GS(th)}$ of the MOSFET 105 is varied with a temperature change. This means that the upper limit value of the main current can be varied with the temperature. On the other hand, it is possible to obtain a commercially available Zener diode whose Zener voltage VZ has various temperature characteristics. Therefore, it is possible to select such a Zener diode that temperature dependence of the Zener voltage $V_Z$ and that of the gate threshold voltage $V_{GS(th)}$ compensate for each other for applying the same to the Zener diode 106. In the semiconductor device having such a Zener diode 106, the value of the voltage $V_R$ required for turning on the MOSFET 105 is constant with no dependence on the temperature. Namely, the upper limit of the main current is constant with no dependence on the temperature according to this semiconductor device.

<8. Embodiment 8>

Figure 8:
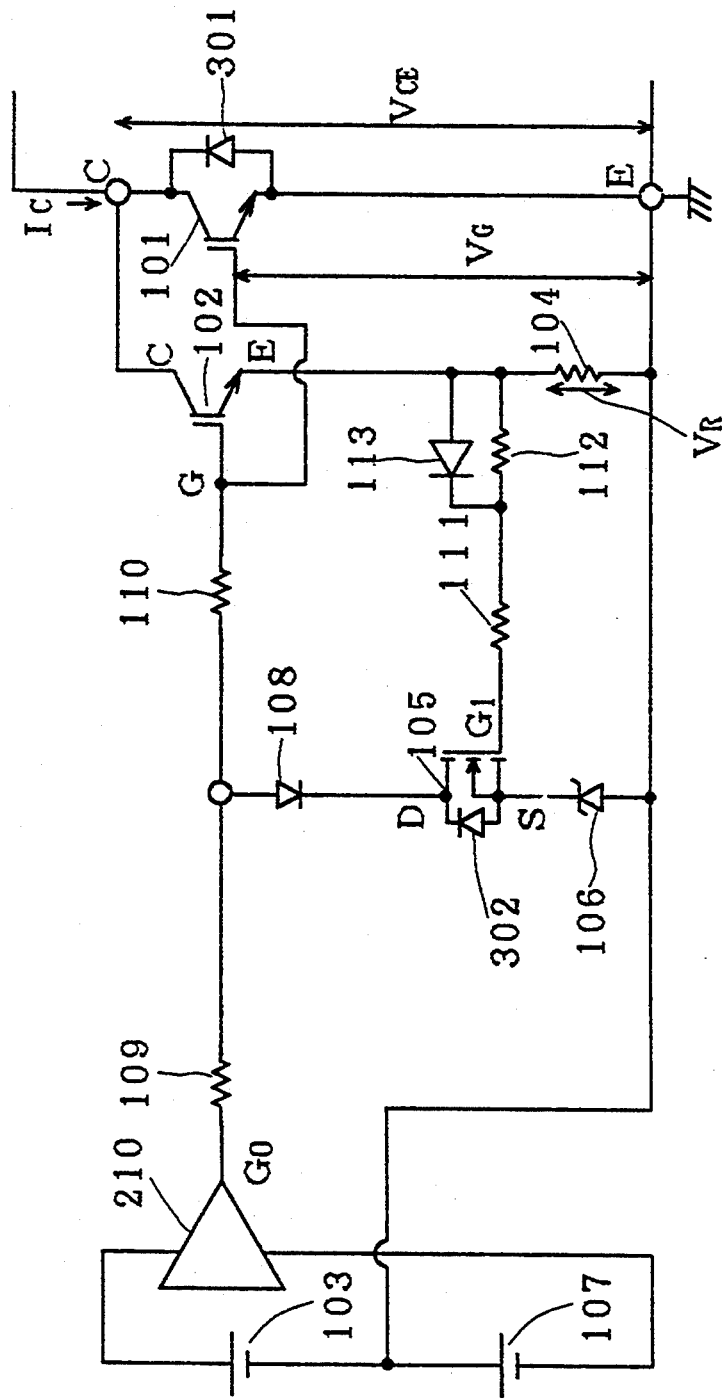
FIG. 8 is a circuit diagram showing the structure of a semiconductor device according to an eighth embodiment of the present invention.

FIG. 8 is a circuit diagram showing the structure of a semiconductor device according to an eighth embodiment of the present invention. This embodiment is so structured that a reverse voltage is applied across a gate G and an emitter E of an IGBT 101 for converting the IGBT 101 into an OFF state. Thus, a reverse bias power source 107 is connected to a gate driving circuit 210, in addition to a power source 103. Therefore, a speed of response for converting the IGBT 101 from an ON state into an OFF state is higher as compared with the device according to the embodiment 6 or 7. Further, it is possible to sufficiently stably implement an OFF state.

This embodiment is so structured that a reverse voltage is applied across the gate G and the emitter E, whereby a potential of the emitter E of the IGBT 101 may increase that of the gate G through a Zener diode 106 and a MOSFET 105, to reduce a gate-to-emitter voltage $V_G$ to a value close to zero. A diode 108 (first diode) is provided in order to prevent this. This diode 108 is interposed between the gate G and a drain D of the MOSFET 105. Further, the diode 108 is interposed in such a direction that a current flowing in the MOSFET 105 forms a forward current of the diode 108.

The diode 108 blocks a current flowing from the emitter E of the IGBT 101 toward the gate G through the Zener diode 106 and the MOSFET 105, i.e., a reverse current of the MOSFET 105. Thus, a negative potential which is outputted by the gate driving circuit 210 is correctly transmitted to the gate G. The diode 108 also serves to prevent the MOSFET 105 from breakdown caused by the reverse current.

The diode 108 will not inhibit the current from forwardly flowing in the MOSFET 105 upon conduction of the MOSFET 105. Therefore, the diode 108 will not inhibit the function of the semiconductor device for preventing an excessive main current.

<9. Embodiment 9>

Figure 9:
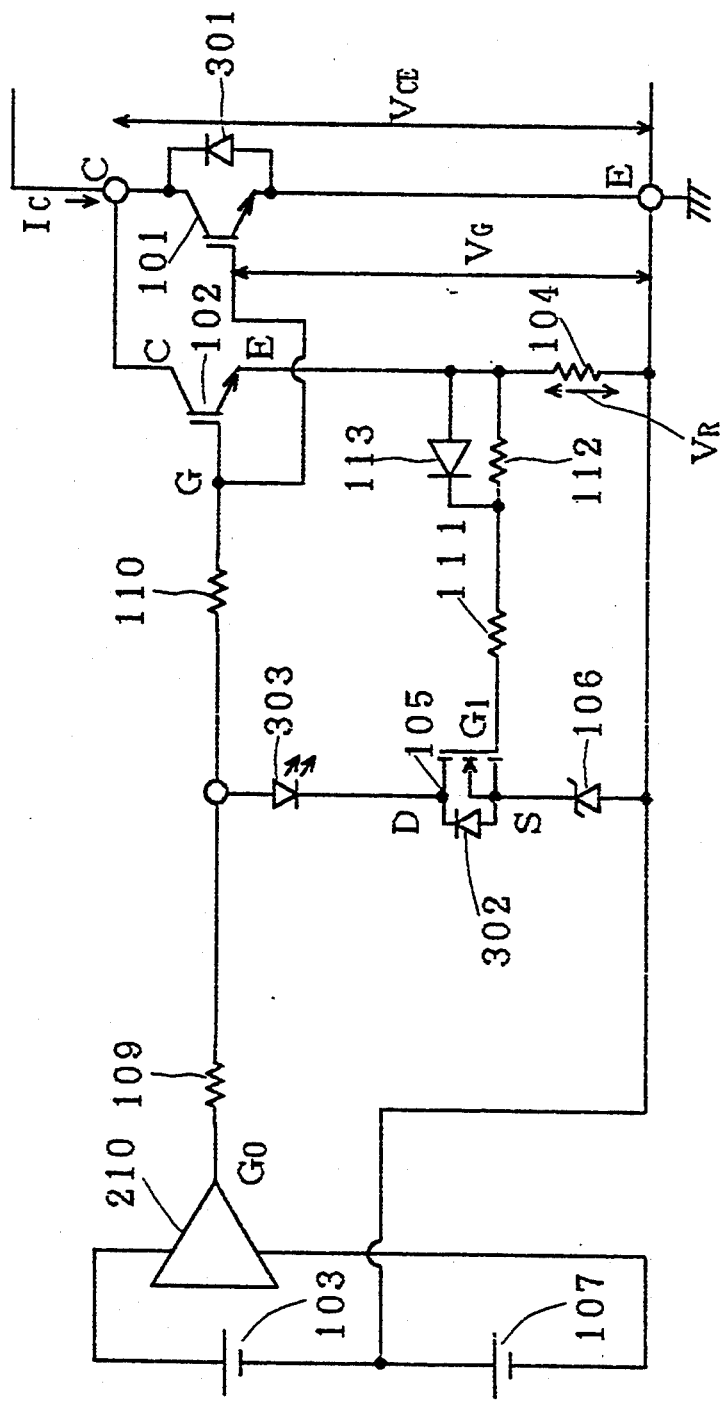
FIG. 9 is a circuit diagram showing the structure of a semiconductor device according to a ninth embodiment of the present invention.

FIG. 9 is a circuit diagram showing the structure of a semiconductor device according to a ninth embodiment of the present invention. According to this embodiment, the diode 108 in the semiconductor device according to the embodiment 8 is replaced by a light emitting diode 303. When a MOSFET 105 is turned on, a current flowing in this MOSFET 105 also flows in the light emitting diode 303, whereby the light emitting diode 303 emits light.

Therefore, it is possible to recognize that a function for limiting a main current acts due to abnormal increase of the main current caused by shorting of a load or the like by light emission of the light emitting diode 303. Namely, it is possible to readily recognize whether the semiconductor device is in a normally operating state or an abnormally operating state.

The light emitting diode 303 also serves the function of the diode 108 in the embodiment 8. Namely, the semiconductor device according to this embodiment implements both of a function of preventing a reverse current of the MOSFET 105 and that of informing abnormality in an operating state of the device, by employing the light emitting diode 303.

<10. Embodiment 10>

Figure 10:
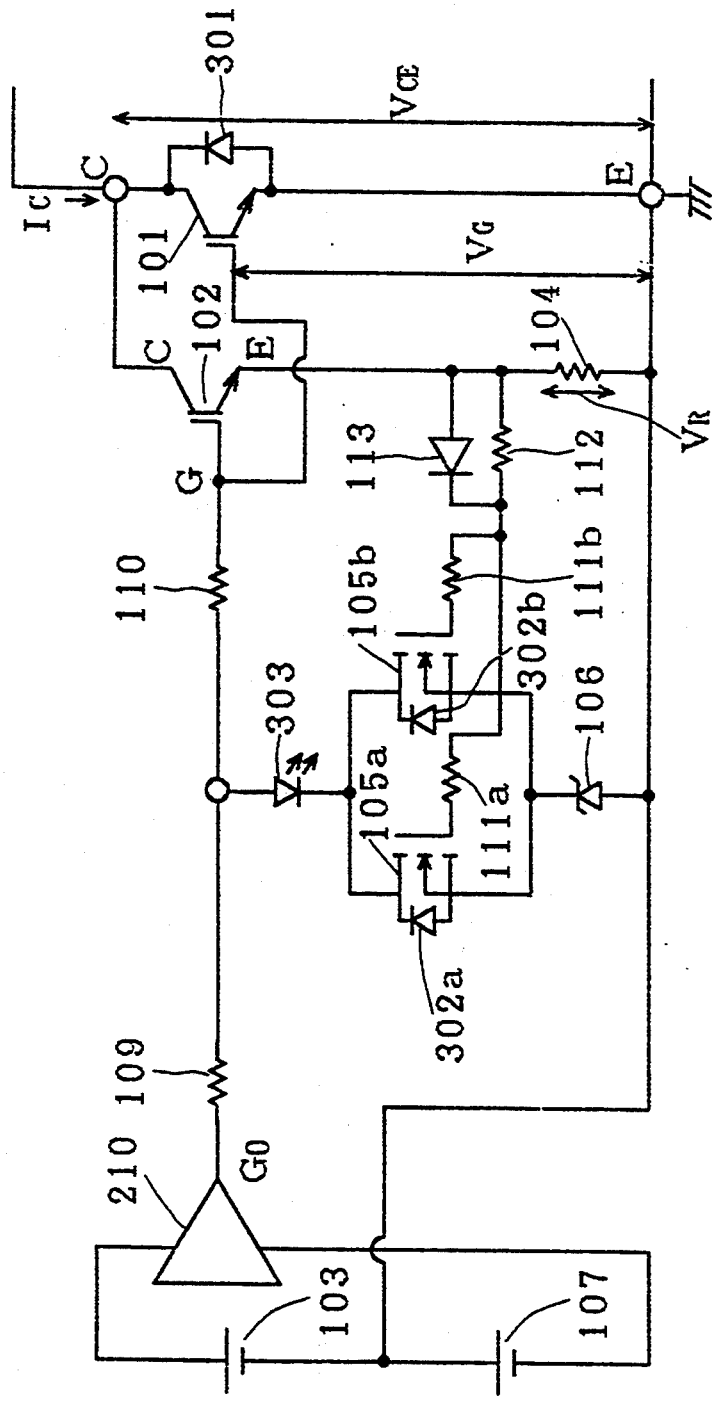
FIG. 10 is a circuit diagram showing the structure of a semiconductor device according to a tenth embodiment of the present invention.

FIG. 10 is a circuit diagram showing the structure of a semiconductor device according to a tenth embodiment of the present invention. According to this embodiment, the MOSFET 105 in the semiconductor device according to the embodiment 9 is formed by two MOSFETs 105a and 105b which are connected in parallel with each other. The MOSFETs 105a and 105b are independently connected with freewheel diodes 302a and 302b respectively, in place of the freewheel diode 302. Further, resistors 111a and 111b are connected to respective gates of the MOSFETs 105a and 105b, in place of the resistor 111. Functions of the freewheel diodes 302a and 302b are similar to that of the freewheel diode 302, while those of the resisters 111a and 111b are similar to that of the resistor 111.

The semiconductor device according to this embodiment is provided with the two MOSFETs 105a and 105b in parallel with each other, whereby ON resistance in ON states of these elements is lower and current capacity is larger as compared with the semiconductor device provided with only one MOSFET 105. In an insulated gate semiconductor device which is applied to a switching element such as an inverter, output resistance of the gate driving circuit 210 and the resistance value of the resistor 109 are set at low values since it is necessary to turn the IGBT 101 on and off at a high speed. Particularly in a large insulated gate semiconductor device for supplying a high main current, these resistance values are set at lower levels. In a large insulated gate semiconductor device which switches at a high speed, Therefore, the ON resistance of the MOSFET 105 must be sufficiently low in relation to the resistance value of the resistor 109 and the like. If the ON resistance is insufficiently low as compared with the resistance value of the resistor 109 and the like, it is impossible to sufficiently reduce the gate-to-emitter voltage $V_G$ to limit the main current below a prescribed upper limit value when the MOSFET 105 is turned on. In the large insulated gate semiconductor device, further, current capacity of the MOSFET 105 must be set at a high level since a high current flows in the MOSFET 105 upon conduction thereof. The semiconductor device according to this embodiment satisfies such requirements by forming the MOSFET 105 by the two MOSFETs 105a and 105b which are connected in parallel with each other. The number of the MOSFETs 105a and 105b is not restricted to two, but the MOSFET 105 can be formed by two or more MOSFETs which are connected in parallel with each other at need. When the same MOSFETs are employed, ON resistance of the MOSFET 105 is lowered and the current capacity is increased as the number of the MOSFETs which are connected in parallel with each other is increased, as a matter of course.

<11. Embodiment 11>

Figure 11:
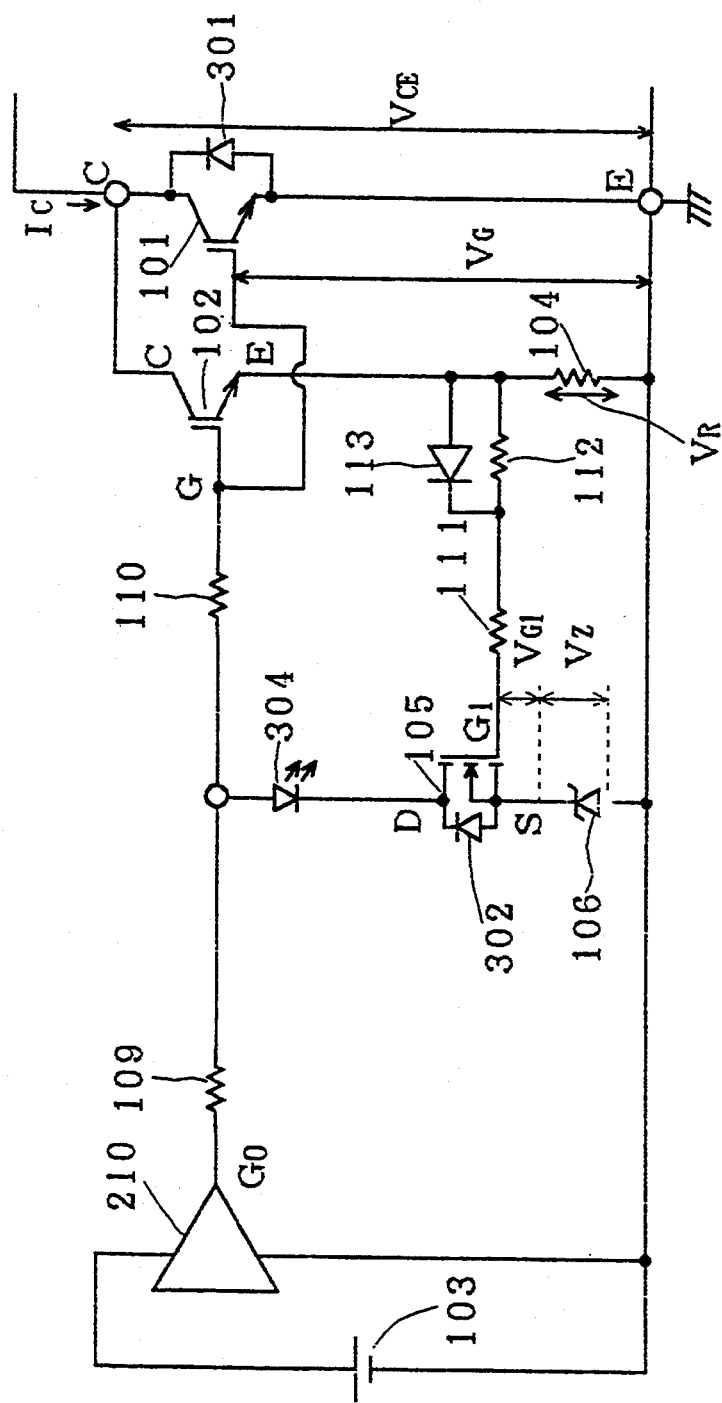
FIG. 11 is a circuit diagram showing the structure of a semiconductor device according to an eleventh embodiment of the present invention.

FIG. 11 is a circuit diagram showing the structure of a semiconductor device according to an eleventh embodiment of the present invention. According to this embodiment, a light emitting diode 304 is connected in series to the MOSFET 105 in the semiconductor device 105 according to the embodiment 6. The light emitting diode 304 is connected in such a direction that a current forwardly flowing in the MOSFET 105, i.e., that flowing from the drain D toward the source S of the MOSFET 105, forms a forward current of the light emitting diode 304.

Upon conduction of the MOSFET 105, the current simultaneously flows also to the light emitting diode 304. Namely, the light emitting diode 304 emits light upon conduction of the MOSFET 105. Therefore, it is possible to recognize that a function for limiting the main current serves due to abnormal increase of the main current resulting from shorting of a load or the like by light emission of the light emitting diode 304. Namely, it is possible to readily recognize whether the semiconductor device is in a normally operating state or an abnormally operating state by a simple structure.

<12. Embodiment 12>

In each of the aforementioned embodiments, a circuit part including the MOSFET 105 and the Zener diode 106 can be integrated on a single semiconductor chip. Since a part of the circuit is integrated, the semiconductor device can be readily assembled. Since the MOSFET 105 and the Zener diode 106 are integrated on a single semiconductor chip, further, it is possible to form the device with excellent reproducibility so that temperature characteristics of these elements are complementary to each other. Further, the temperatures of these elements are further homogenized since the same are formed on the same semiconductor substrate. Thus, it is possible to maintain the voltage $V_R$, which is required for turning on the MOSFET 105, in a further unchangeable state with respect to a temperature change.

Figure 12:
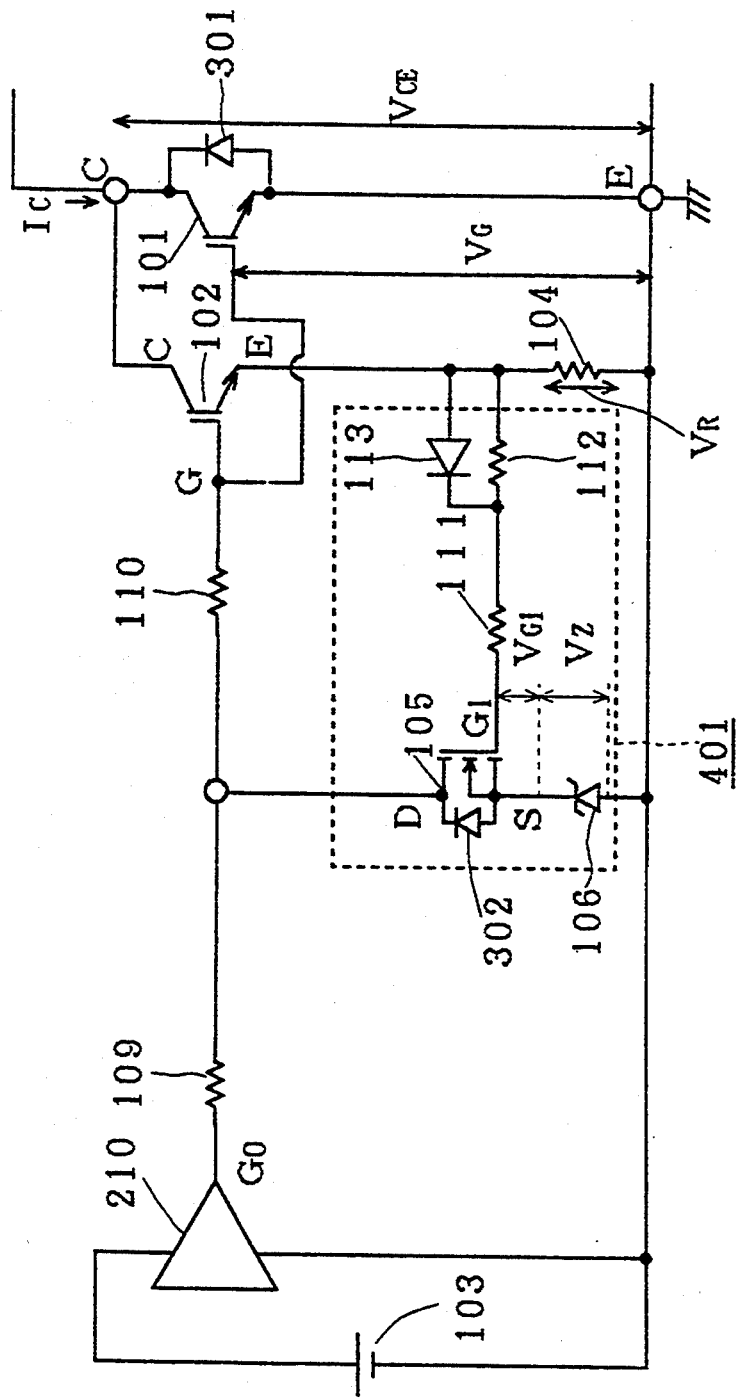
FIG. 12 is a circuit diagram showing the structure of a semiconductor device according to a twelfth embodiment of the present invention.

FIG. 12 is a circuit diagram showing a device which is obtained by integrating a part of the device shown in FIG. 7. According to this device, a circuit part 401 including a freewheel diode 302, resistors 111 and 112 and a diode 113 is integrated. On the other hand, resistors 104, 109 and 110 are not integrated but set around the integrated circuit part 401. The respective circuit components included in the integrated circuit part 401 are capable of relatively widely coping with various rated values of the semiconductor device. On the other hand, it is necessary to select resistance values, heat resistance etc. of the resistors 104, 109 and 110, which are not integrated, in response to the rated value of a main current to be controlled, for example. According to this embodiment, these resistors are independently arranged in the exterior of the integrated circuit part 401 while the circuit components relatively non-dependent on the rated values of the device are integrated, whereby the integrated circuit part 401 can be applied to semiconductor devices of various rated values in common. Namely, the device according to this embodiment can advantageously reduce a manufacturing cost.

<13. Embodiment 13>

Figure 13:
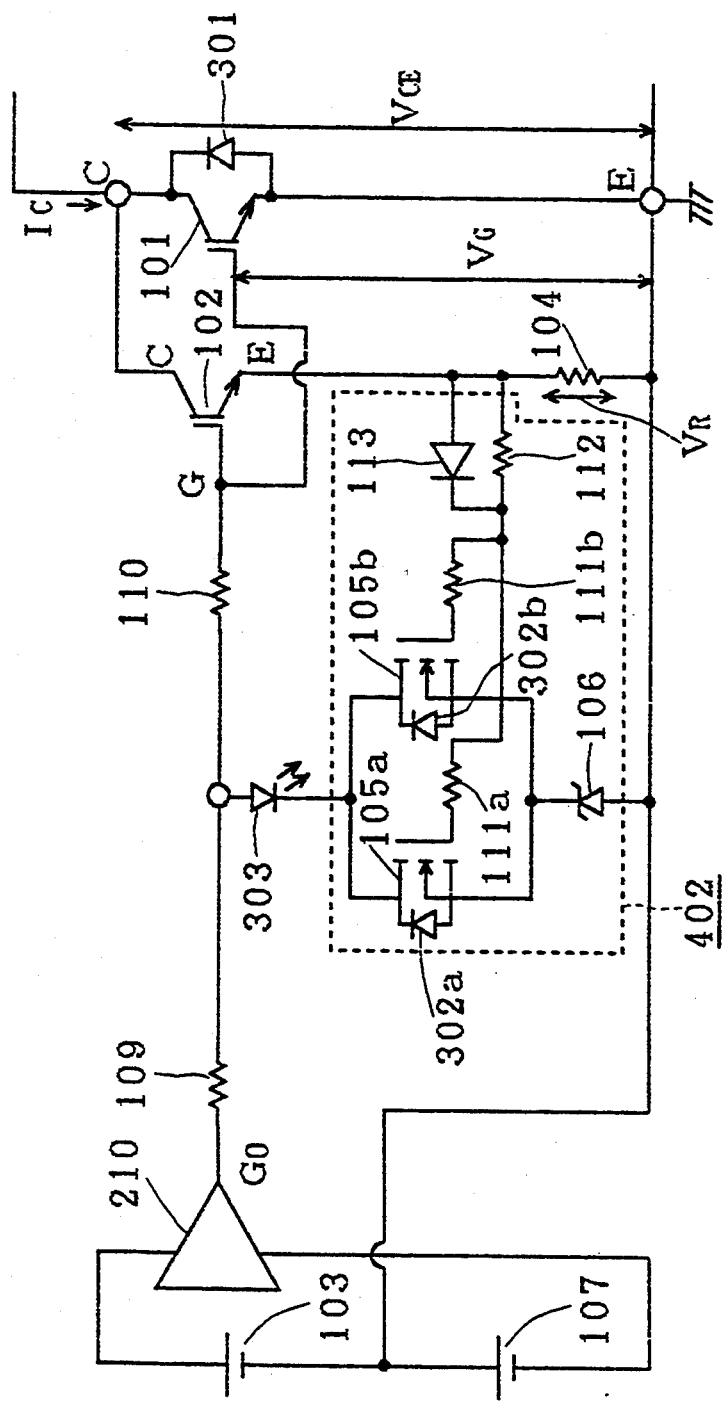
FIG. 13 is a circuit diagram showing the structure of a semiconductor device according to a thirteenth embodiment of the present invention.

FIG. 13 is a circuit diagram showing a device which is obtained by integrating a part of the device shown in FIG. 10. According to this device, MOSFETs 105a and 105b, a Zener diode 106, resistors 111a, 111b and 112 and a diode 113 are integrated to form an integrated circuit part 402. On the other hand, resistors 104, 109 and 110 are not integrated but set around the integrated circuit part 402. Also in the device according to this embodiment, the circuit components dependent on the rated values of the device are independently arranged in the exterior of the integrated circuit part 402 while the circuit components relatively non-dependent on the rated values of the device are integrated, whereby the manufacturing cost can be advantageously reduced.

<14. Embodiment 14>

<14-1. Structure of Device>

Figure 14:
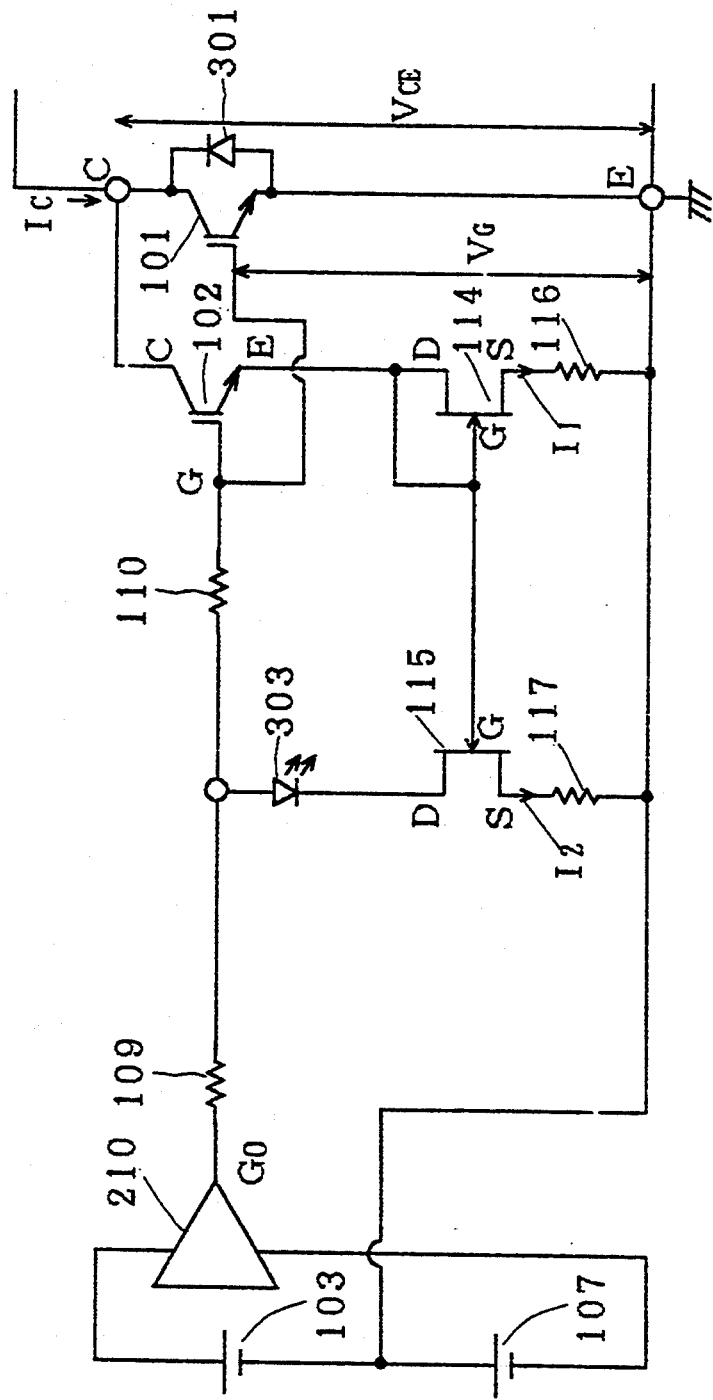
FIG. 14 is a circuit diagram showing the structure of a semiconductor device according to a fourteenth embodiment of the present invention.
Figure 15:
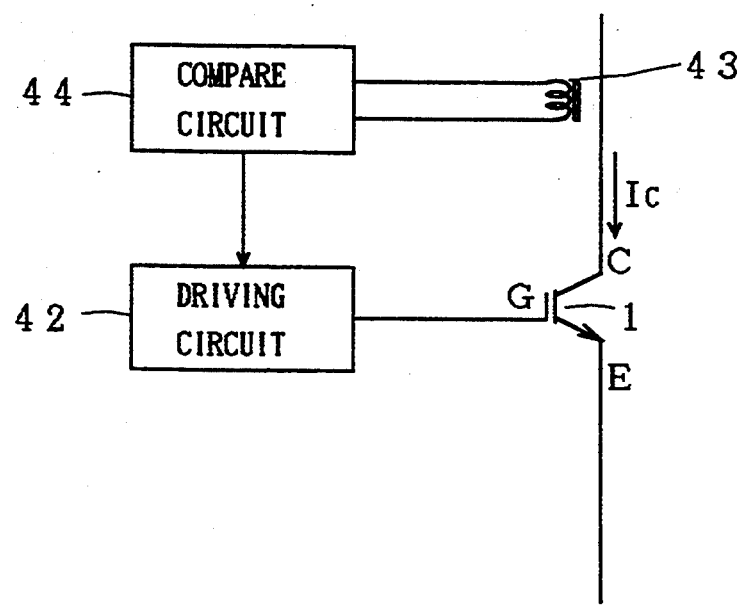
FIG. 15 is a block diagram showing the structure of a conventional insulated gate semiconductor device.

FIG. 14 is a circuit diagram showing the structure of a semiconductor device according to a fourteenth embodiment of the present invention. This embodiment employs a current mirror circuit having two junction field effect transistors (JFETs). A series circuit of a JFET 114 (first junction field effect transistor element) and a resistor 116 (first resistor) is interposed between emitters E of IGBTs 102 and 101. A drain D of the JFET 114 is connected to the emitter E of the IGBT 102, while its source S is connected to an end of the resistor 116. Another end of the resistor 116 is connected to the emitter E of the IGBT 101. A current I1 flowing through the JFET 114 anti the resistor 116 coincides with a collector current $I_C$ of the IGBT 102. A gate G of the JFET 114 is shorted with the drain D.

On the other hand, another JFET 115 (second junction field effect transistor element) forms a series circuit of a light emitting diode 303 and a resistor 117 (second resistor). An anode of the light emitting diode 303 is coupled to gates G of the IGBTs 101 and 102 through a resistor 110. A cathode of the light emitting diode 303 is connected to a drain D of the JFET 115. A source S of the JFET 115 is connected to an end of a resistor 117. Another end of the resistor 117 is connected to the emitter E of the IGBT 101. Gates G of the JFETs 115 and 114 are connected with each other. According to this embodiment, a reverse bias power source 107 is connected to a gate driving circuit 210 in addition to a power source 103, similarly to the embodiment 9.

<14-2. Characteristic Operation of Device>

As hereinabove described, the JFETs 114 and 115 form a current mirror circuit. Further, the resistors 116 and 117 apply negative feedbacks to these JFETs 114 and 115. Therefore, the value of a current I2 flowing in the JFET 115 is mostly determined by a ratio of the resistor 116 to the resistor 117 and the current I1, with no remarkable dependence on the characteristics of the JFETs 114 and 115. Namely, the value of the current I2 regularly coincides with a product of the ratio of the resistor 116 to the resistor 117 and the current I1. Therefore, a current which is proportionate to a main current which is supplied to a load regularly flows to the JFET 115. High accuracy which is responsive to accuracy of resistance values of the two resistors 116 and 117 is guaranteed for the value of such a current I2. Further, fluctuation of the resistance values of the resistors 116 and 117 with a temperature change is so small that the relation between the main current and tile current I2 is not much dependent on the temperature. In the semiconductor device according to this embodiment, therefore, a function of suppressing an overcurrent is implemented in high accuracy and this function is not much dependent on the temperature.

Similarly to the semiconductor device according to the embodiment 9, further, a reverse bias power source 107 is connected to a gate driving circuit 210 in addition to a power source 103, whereby the IGBT 101 can be converted from an ON state to an OFF state at a high speed of response and the OFF state can be sufficiently stably implemented. Further, the light emitting diode 303 implements both of a function for preventing a reverse current of the JFET 115, and that for informing abnormality in an operating state of the device.

<Other Modifications>

(1) Although the IGBTs 101 and 102 are prepared from n-channel IGBTs in the aforementioned embodiments, it is possible to alternatively employ p-channel IGBTs according to the present invention.

(2) The IGBTs 101 and 102 are employed as elements for controlling and detecting the main currents in the semiconductor devices according to the aforementioned embodiments. However, the present invention is not restricted to IGBTs but is also applicable to a semiconductor device generally employing an insulated gate element such as a MOS field effect transistor element, for example.

While the invention has been shown and described in detail, the foregoing description is in all aspects illustrative and not restrictive. It is therefore understood that numerous modifications and variations can be devised without departing from the scope of the invention.

What is claimed is:

1. An insulated gate semiconductor device comprising:
   (a) a first insulated gate element having a first current electrode, a second current electrode, and a first control electrode being insulated from said first and second current electrodes, a first conducting state being attained between said first and second current electrodes in response to a first voltage being applied across said first control electrode and said second current electrodes, said first conducting state shifting from a cut-off state in response to an increase of said first voltage;

(b) a second insulated gate element having a third current electrode, a fourth current electrode, and a second control electrode being insulated from said third and fourth current electrodes, a second conducting state being attained between said third and fourth current electrodes in response to a second voltage being applied across said second control electrode and said fourth current electrode, said second conducting state shifting from a cut-off state in response to an increase of said second voltage, said third current electrode being connected with said first current electrode, said second control electrode being connected with said first control electrode, said fourth current electrode being coupled with said second current electrode;

(c) a first resistor connected between said second current electrode and said fourth current electrode;

(d) gate driving means having an output terminal coupled to said first and second control electrodes for outputting a controlled third voltage to said output terminal;

(e) a transistor element having a collector electrode, an emitter electrode and a base electrode, said collector electrode being coupled to said first and second control electrodes, said base electrode being connected to said fourth current electrode, said emitter electrode being coupled with said second current electrode; and (f) a thyristor element having an anode electrode, a cathode electrode and a gate electrode, said anode and cathode electrodes conducting upon temporary increase of a voltage across said gate and cathode electrodes in excess of a prescribed value, said anode electrode being coupled to said first and second control electrodes, said cathode electrode being connected to said second current electrode, and said gate electrode being coupled to said fourth current electrode.

2. An insulated gate semiconductor device in accordance with claim 1, further comprising:

(g) a first diode connected between said emitter electrode of said transistor element and said second current electrode in a direction such that a current flowing from said collector electrode of said transistor element to said emitter electrode thereof forms a forward current, said first diode having a shorter back recovery time than that between said emitter and base electrodes in said transistor element.

3. An insulated gate semiconductor device in accordance with claim 2, wherein
said first insulated gate element comprises:
(a−1) a first insulated gate bipolar transistor element, and
said second insulated gate element comprises:
(b−1) a second insulated gate bipolar transistor element.

4. An insulated gate semiconductor device in accordance with claim 3, wherein
a current capacity of said second insulated gate bipolar transistor element is smaller than that of said first insulated gate bipolar transistor element.

5. An insulated gate semiconductor device in accordance with claim 4, further comprising:
(h) a second resistor connected between said emitter electrode of said transistor element and said gate electrode of said thyristor element.

6. An insulated gate semiconductor device in accordance with claim 5, further comprising:
(i) a third resistor connected between said output terminal of said driving means and said first and second control electrodes.

7. An insulated gate semiconductor device in accordance with claim 1, further comprising:
(j) a Zener diode connected between said emitter electrode of said transistor element and said second current electrode in such a direction that a current flowing from said collector electrode of said transistor element to said emitter electrode thereof forms a reverse current.

8. An insulated gate semiconductor device in accordance with claim 1, wherein
said gate driving means comprises:
a gate driving part capable of outputting a potential lower than that of said second current electrode as said controlled voltage when said first and second insulated gate elements are to be cut off,
said insulated gate semiconductor device further comprising:
(k) a diode connected between said first and second control electrodes, said collector electrode of said transistor element and said anode electrode of said thyristor element in a direction for inhibiting a current flowing from said collector electrode of said transistor element toward said first and second control electrodes.

9. An insulated gate semiconductor device in accordance with claim 1, further comprising:
(l) information means coupled to said transistor element for indicating that said transistor element is in a conducting state.

10. An insulated gate semiconductor device comprising:

(a) a first insulated gate element having a first current electrode, a second current electrode, and a first control electrode being insulated from said first and second current electrodes, a first conducting state being attained between said first and second current electrodes in response to a first voltage being applied across said first control electrode and said second current electrode, said first conducting state shifting from a cut-off state in response to an increase of said first voltage;

(b) a second insulated gate element having a third current electrode, a fourth current electrode, and a second control electrode being insulated from said third and fourth current electrodes a second conducting state being attained between said third and fourth current electrodes in response to a second voltage being applied across said second control electrode and said fourth current electrode, said second conducting state shifting from a cut-off state in response to an increase of said second voltage, said third current electrode being connected with said first current electrode, said second control electrode being connected with said first control electrode, said fourth current electrode being coupled with said second current electrode;

(c) current detection means having a voltage output terminal and being connected between said second and fourth current electrodes for detecting a current passing through said second insulated gate element and flowing through said third and fourth current electrodes, said current detection means outputting a voltage corresponding to said current from said voltage output terminal;

(d) gate driving means having an output terminal coupled to said first and second control electrodes, for outputting a controlled third voltage to said output terminal;

(e) a MOS field effect transistor element having a fifth current electrode, a sixth current electrode, and a third control electrode, said fifth current electrode being coupled to said first and second control electrodes, said third control electrode being coupled to said voltage output terminal of said current detection means, said sixth current electrode being coupled to said second current electrode; and (f) a Zener diode connected between said sixth current electrode and said second current electrode in such a direction that a current passing through said MOS field effect transistor element and flowing across said fifth and sixth current electrodes in a forward direction forms a reverse current.

11. An insulated gate semiconductor device in accordance with claim 10, wherein a Zener voltage of said Zener diode has complementary temperature characteristics with respect to channel temperature characteristics of a gate-source threshold voltage of said MOS field effect transistor element.

12. An insulated gate semiconductor device in accordance with claim 10, wherein
said current detection means comprises:
a first resistor connected between said second and fourth current electrodes, an end of said first resistor being coupled to said fourth current electrode serving as said voltage output terminal 13. An insulated gate semiconductor device in accordance with claim 10, wherein
said MOS field effect transistor element comprises: a plurality of unit MOS field effect transistor elements having seventh current electrodes, eighth current electrodes and fourth control electrodes,
said seventh current electrodes, said eighth current electrodes and said fourth control electrodes of said plurality of unit MOS field effect transistor elements being so mutually connected that said seventh current electrodes, said eighth current electrodes and said fourth control electrodes serve as said fifth current electrode, said sixth current electrode, and said third control electrode, respectively.

14. An insulated gate semiconductor device in accordance with claim 10, further comprising:
(g) a light emitting diode coupled to said MOS field effect transistor, said light emitting diode connected in such a direction that a current passing through said MOS field effect transistor element and flowing across said fifth and sixth current electrodes in a forward direction forms a forward current.

15. An insulated gate semiconductor device in accordance with claim 10, wherein
said gate driving means comprises:
a gate driving part capable of outputting a voltage corresponding to a potential lower than that or said second current electrode as said controlled third voltage,
said insulated gate semiconductor device further comprising:

(g) a first diode, connected between said first and second control electrodes and said fifth current electrode in such a direction that a current passing through said MOS field effect transistor element and flowing across said fifth and sixth current electrodes in a forward direction forms a forward current.

16. An insulated gate semiconductor device in accordance with claim 15, wherein
said first diode is a light emitting diode.

17. An insulated gate semiconductor device in accordance with claim 12, further comprising:
(h) a second resistor connected between said third control electrode and said voltage output terminal of said current detection means.

18. An insulated gate semiconductor device in accordance with claim 17, further comprising:
(i) a diode connected in parallel with said second resistor, said diode connected between said third control electrode and said voltage output terminal of said current detection means in a direction capable of transmitting a voltage, being outputted from said voltage output terminal to shift said MOS field effect transistor element from a cutoff state to a conducting state, to said third control electrode in a shorted state of said diode.

19. An insulated gate semiconductor device in accordance with claim 18, wherein
an least said MOS field effect transistor element, said Zener diode, said second resistor and said diode are integrated on a single semiconductor chip.

20. An insulated gate semiconductor device in accordance with claim 19, wherein
said first insulated gate element comprises:
(a−1) a first insulated gate bipolar transistor element, and
said second insulated gate element comprises:
(b−1) a second insulated gate bipolar transistor element.

21. An insulated gate semiconductor device in accordance with claim 20, wherein
a current capacity of said second insulated gate bipolar transistor element is smaller than that of said first insulated gate bipolar transistor element.

22. An insulated gate semiconductor device in accordance with claim 21, further comprising:
(j) a third resistor connected between said output terminal of said driving means and said first and second control electrodes, an end of said third resistor being connected to said output terminal of said driving means with another end of said third resistor being coupled to said fifth current electrode.

23. An insulated gate semiconductor device in accordance with claim 22, further comprising:
(k) a fourth resistor connected between said third resistor and said first and second control electrodes, an end of said fourth resistor being connected to said first and second control electrodes with another end of said fourth resistor being coupled to said fifth current electrode.

24. An insulated gate semiconductor device comprising:
(a) a first insulated gate element having a first current electrode, a second current electrode, and a first control electrode being insulated from said first and second current electrodes, a first conducting state being attained between said first and second current electrodes in response to a first voltage being applied across said first control electrode and said second current electrode, said first conducting state shifting from a cut-off state in response to an increase of said first voltage;

(b) a second insulated gate element having a third current electrode, a fourth current electrode, and a second control electrode being insulated from said third and fourth current electrodes, a second conducting state being attained between said third and fourth current electrodes in response to a second voltage being applied across said second control electrode and said fourth current electrode, said second conducting state shifting state shifting from a cut-off state in response to an increase of said second voltage, said third current electrode being connected with said first current electrode, said second control electrode being connected with said first control electrode, said fourth current electrode being coupled with said second current electrode;

(c) a first junction field effect transistor element connected between said second and fourth current electrodes and having a fifth current electrode, a sixth current electrode, and a third control electrode, said fifth current electrode being connected to said fourth current electrode, said sixth current electrode being coupled to said second current electrode, said third control electrode being coupled to said fourth current electrode;

(d) a first resistor connected between said sixth current electrode and said second current electrode;

(e) gate driving means having an output terminal coupled to said first and second control electrodes, for outputting a controlled third voltage to said output terminal;

(f) a second junction field effect transistor element having a seventh current electrode, an eighth current electrode, and a fourth control electrode, said seventh current electrode being coupled to said first and second control electrodes, said fourth control electrode being coupled to said third control electrode, said eighth current electrode being coupled to said second current electrode; and (g) a second resistor connected between said eighth current electrode and said second current electrode.

25. An insulated gate semiconductor device in accordance with claim 24, wherein
said first insulated gate element comprises:
(a—1) a first insulated gate bipolar transistor element, and
said second insulated gate element comprises:
(b—1) a second insulated gate bipolar transistor element.

26. An insulated gate semiconductor device in accordance with claim 25, wherein
a current capacity of said second insulated gate bipolar transistor element is smaller than that of said first insulated gate bipolar transistor element.

27. An insulated gate semiconductor device in accordance with claim 26, further comprising:
(h) a third resistor connected between said output terminal of said driving means and said first and second control electrodes, an end of said third resistor being connected to said output terminal of said driving means, with another end of said third resistor being coupled to said seventh current electrode.

28. An insulated gate semiconductor device in accordance with claim 27, further comprising:
(i) a fourth resistor connected between said third resistor and said first and second control electrodes, an end of said fourth resistor being connected to said first and second control electrodes, with another end of said fourth resistor being coupled to said seventh current electrode.

* * * * *